United States Patent
Sahu et al.

(10) Patent No.: US 9,640,522 B1
(45) Date of Patent: May 2, 2017

(54) V1 AND HIGHER LAYERS PROGRAMMABLE ECO STANDARD CELLS

(71) Applicant: QUALCOMM Incorporated, San Diego, CA (US)

(72) Inventors: Satyanarayana Sahu, San Diego, CA (US); Vinod Gupta, Bangalore (IN); Xiangdong Chen, San Diego, CA (US); Triveni Rachapalli, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/133,143

(22) Filed: Apr. 19, 2016

(51) Int. Cl.
  *H01L 21/70* (2006.01)
  *H01L 27/02* (2006.01)
  *H01L 23/528* (2006.01)
  *G06F 17/50* (2006.01)

(52) U.S. Cl.
  CPC ...... *H01L 27/0207* (2013.01); *G06F 17/5077* (2013.01); *H01L 23/5283* (2013.01)

(58) Field of Classification Search
  CPC .............. H01L 23/5283; H01L 29/785; H01L 27/11807; H01L 27/0207; H01L 29/42384; H01L 29/6681; H01L 27/0924; G06F 17/5077
  See application file for complete search history.

(56) References Cited

U.S. PATENT DOCUMENTS

| | | | |
|---|---|---|---|
| 6,467,074 B1 | 10/2002 | Katsioulas et al. | |
| 6,536,028 B1 | 3/2003 | Katsioulas et al. | |
| 6,823,499 B1 | 11/2004 | Vasishta et al. | |
| 8,446,176 B1 | 5/2013 | Yang et al. | |
| 9,502,351 B1* | 11/2016 | Sahu | H01L 23/5286 |
| 2014/0097493 A1* | 4/2014 | Baek | H01L 27/1211 257/347 |
| 2014/0239412 A1* | 8/2014 | Yang | H01L 27/0207 257/401 |
| 2014/0264924 A1 | 9/2014 | Yu et al. | |
| 2015/0370949 A1* | 12/2015 | Moroz | G06F 17/5072 716/119 |
| 2016/0027769 A1* | 1/2016 | Baek | H01L 29/785 257/369 |
| 2016/0055285 A1* | 2/2016 | Baek | G06F 17/5072 716/122 |

\* cited by examiner

*Primary Examiner* — Trung Q Dang
(74) *Attorney, Agent, or Firm* — Arent Fox LLP

(57) ABSTRACT

In an aspect of the disclosure, apparatuses for reducing the cost of using an ECO standard cell library in chip design are provided. Such an apparatus may be a MOS device including several regions. The MOS device may include a pMOS transistor and an nMOS transistor in a first region of the device. The pMOS transistor gate of the pMOS transistor and the nMOS transistor gate of the nMOS transistor may be formed by a gate interconnect extending in a first direction across the device. The MOS device may include several unutilized pMOS transistors and several unutilized nMOS transistors in a second region of the device adjacent to the first region. Fins of the pMOS transistors and the nMOS transistors in the first region may be disconnected from fins of the unutilized pMOS transistors and the unutilized nMOS transistors in the second region.

26 Claims, 12 Drawing Sheets

V1 AND HIGHER LAYERS PROGRAMMABLE ECO STANDARD CELLS

BACKGROUND

Field

The present disclosure relates generally to semiconductor design, and more particularly, to an engineering change order (ECO) standard cell library architecture.

Background

In chip design, an ECO is the process of inserting a logic change directly into the netlist after it has already been processed by an automatic tool. Before the chip masks are made, ECOs are usually done to save time, by avoiding the need for full ASIC logic synthesis, technology mapping, place, route, layout extraction, and timing verification. A standard cell is an integrated circuit that may be implemented with digital logic. An application-specific integrated circuit (ASIC), such as a system-on-a-chip (SoC) device, may contain thousands to millions of standard cells. An ECO standard cell is a standard cell designed for subsequent ECOs.

Traditionally, an ECO standard cell is designed by keeping fixed base layers (e.g., layers below the via zero (V0) layer, such as layers associated with front-end-of-line (FEOL) and mid-end-of-line (MEOL)). V0 and M1 layers may change based on an ECO, as those layers are programmable in a traditional ECO standard cell library. V0 and M1 layers may contribute three masks in a 14 nm manufacturing process and six masks in a 10 nm manufacturing process. Therefore, using a traditional ECO standard cell library in chip design may be expensive because of the cost associated with changing the masks for V0 and M1 layers.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The metal one (M1) layer may not be used for top-level routing (e.g., inter-cell routing) in advanced technology nodes because it may be too complex for a place and route tool to handle M1 layer design rules. V0 and M1 layers may change based on an ECO as those layers are programmable in a traditional ECO standard cell library. V0 and M1 layers may contribute three masks in a 14 nm manufacturing process and six masks in a 10 nm manufacturing process. Therefore, using a traditional ECO standard cell library in chip design may be expensive because of the cost associated with changing the masks for V0 and M1 layers.

In an aspect of the disclosure, apparatuses for reducing the cost of using an ECO standard cell library in chip design are provided. Such an apparatus may be a metal oxide semiconductor (MOS) device including several regions. The MOS device may include several p-type MOS (pMOS) transistors and several n-type MOS (nMOS) transistors in a first region of the device. Each of the pMOS transistors and nMOS transistors has fins. The pMOS transistors may include a pMOS transistor having a pMOS transistor gate, a pMOS transistor source, and a pMOS transistor drain. The nMOS transistors may include an nMOS transistor having an nMOS transistor gate, an nMOS transistor source, and an nMOS transistor drain. The pMOS transistor gate and the nMOS transistor gate may be formed by a gate interconnect extending in a first direction across the device.

The MOS device may include several unutilized pMOS transistors and several unutilized nMOS transistors in a second region of the device. The second region may be adjacent to the first region. Each of the unutilized pMOS transistors and unutilized nMOS transistors may have fins. Fins of the pMOS transistors and the nMOS transistors in the first region may be disconnected from fins of the unutilized pMOS transistors and the unutilized nMOS transistors in the second region.

In an aspect of the disclosure, a method and an apparatus for operating a MOS device are provided. The apparatus may operate a first plurality of pMOS transistors in a first region of the device. The apparatus may operate a first plurality of nMOS transistors in the first region of the device. Each of the first plurality of pMOS transistors and each of the first plurality of nMOS transistors may have fins. The first plurality of pMOS transistors may include a first pMOS transistor having a first pMOS transistor gate, a first pMOS transistor source, and a first pMOS transistor drain. The first plurality of nMOS transistors may include a first nMOS transistor having a first nMOS transistor gate, a first nMOS transistor source, and a first nMOS transistor drain. The first pMOS transistor gate and the first nMOS transistor gate may be formed by a first gate interconnect extending in a first direction across the device, The device may further include a second plurality of unutilized pMOS transistors and a second plurality of unutilized nMOS transistors in a second region of the device. The second region may be adjacent to the first region. Each of the second plurality of unutilized pMOS transistors and each of the second plurality of unutilized nMOS transistors may have fins. Fins of the first plurality of pMOS transistors and the first plurality of nMOS transistors in the first region may be disconnected from fins of the second plurality of unutilized pMOS transistors and the second plurality of unutilized nMOS transistors in the second region.

DETAILED DESCRIPTION

Figure 1:
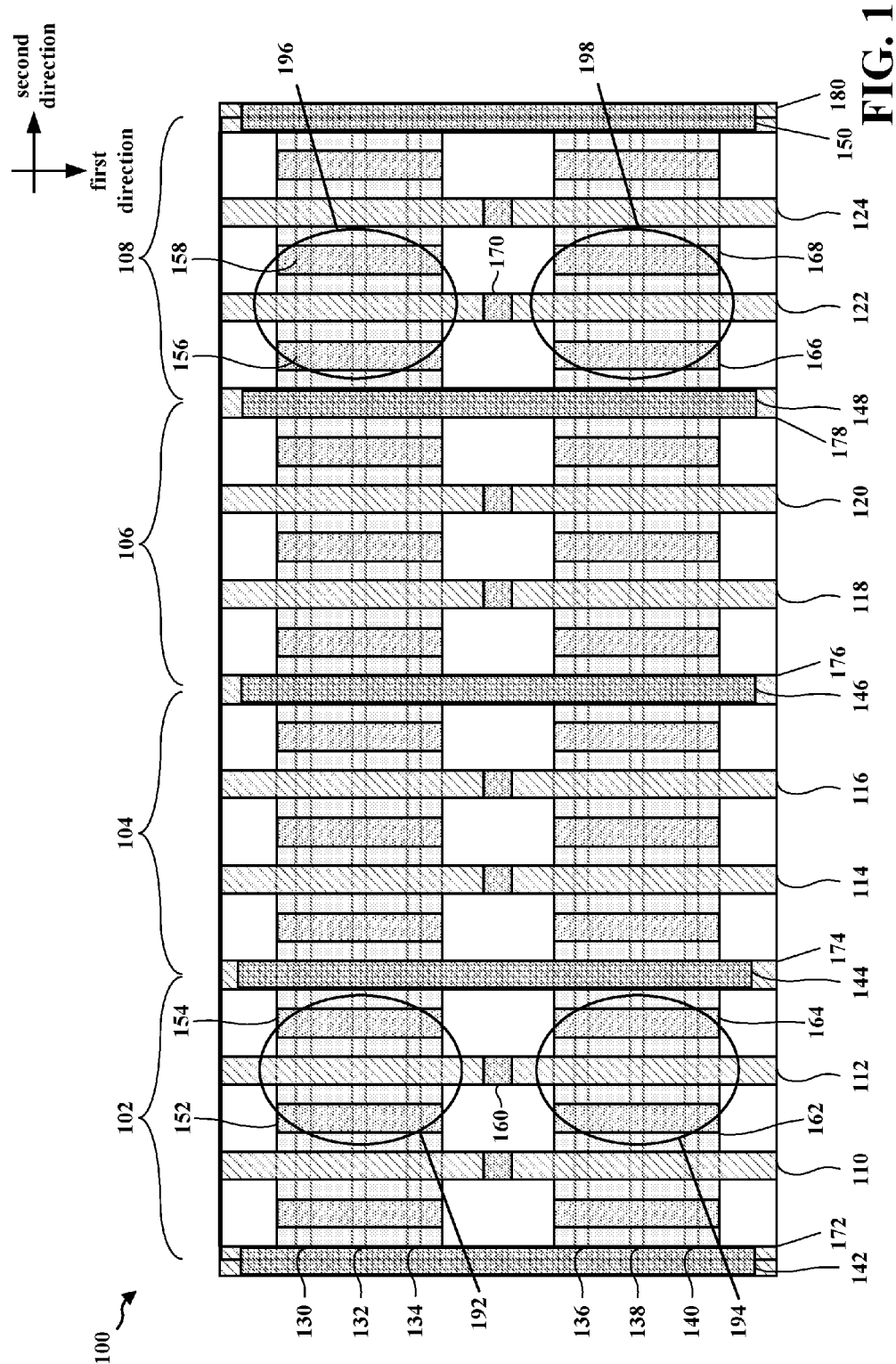
FIG. 1 is a diagram illustrating an exemplary layout of fixed base layers of an ECO standard cell.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of semiconductor design will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

Traditionally, an ECO standard cell may be designed by keeping fixed base layers (e.g., layers below V0, such as layers associated with FEOL and MEOL). V0 and M1 layers in traditional ECO standard cells may change based on an ECO as those layers are programmable in a traditional ECO standard cell library. Changes to V0 and M1 layers may contribute additional masks, for example, three additional masks in a 14 nm manufacturing process and six additional masks in a 10 nm manufacturing process. Therefore, using a traditional ECO standard cell library in chip design may be expensive because of the cost associated with changing the masks for V0 and M1 layers. However, it is noted that the M1 layer may not be used for top-level routing (e.g., inter-cell routing) in advanced technology nodes because it may be too complex for a place and route tool to handle M1 layer design rules. Because the M1 layer may not be used for top-level routing in advance technology nodes, the M1 layer may be fixed for intra-cell connections and not subject to any change by an ECO. Therefore, in an effort to reduce masks, M1 and V0 layers are fixed, in addition to the base layers, in the ECO standard cell examples described below.

An exemplary ECO standard cell is described below with reference to FIGS. 1-12. The exemplary ECO standard cell has fixed M1, V0, and base layers, and has programmable V1 and above layers. The exemplary ECO standard cell has a larger area/footprint with fixed M1 and V0 layers than an ECO standard cell without fixed M1 and V0 layers due to the need for additional area for the fixed M1 interconnects. Only V1 and higher layers of the exemplary ECO standard cell may be changed in an ECO. Therefore, masks for M1 and V0 layers may not be changed upon an ECO, resulting in a significant cost savings. Because M1 and V0 layers are fixed, some of the transistors formed may end up being left unutilized. Albeit the unutilized transistors may increase the area/footprint of the standard cell slightly, it is an acceptable tradeoff in view of the cost saving from the reduced number of masks upon ECOs. In the disclosure below, an exemplary layout of fixed base layers of the exemplary ECO standard cell is described with respect to FIG. 1. An exemplary layout of fixed M1 and V0 layers of the exemplary ECO standard cell is described with respect to FIG. 2. An exemplary layout of fixed base, M1, and V0 layers of the exemplary ECO standard cell is described with respect to FIG. 3. ECO examples utilizing the fixed base, M1, and V0 layers are provided with respect to FIGS. 4-11. In such examples, layers higher than M1 are programmed pursuant to an ECO, while layers M1 and lower remain fixed and unchanged. A flowchart of a method of operating a MOS device/exemplary ECO standard cell is described with respect to FIG. 12.

FIG. 1 is a diagram 100 illustrating an exemplary layout of the fixed base layers of an ECO standard cell. FIG. 1 illustrates the fixed base layers below V0. The fixed base layers include gate interconnects (also referred to as "POLY" interconnects) 110, 112, 114, 116, 118, 120, 122, 124, 172, 174, 176, 178, and 180 extending across the ECO standard cell in a first direction (e.g., vertical direction in FIG. 1). The gate interconnect 112 may form gates for a pMOS transistor 192 and an nMOS transistor 194, and the gate interconnect 122 may form gates for a pMOS transistor 196 and an nMOS transistor 198. The gate interconnects 110, 114, 116, 118, 120, 124, 172, 174, 176, 178, and 180 are unutilized in any MOS transistor.

At the fixed base layers, the ECO standard cell includes fins 130, 132, 134, 136, 138, and 140 extending across the ECO standard cell in a second direction (e.g., horizontal direction in FIG. 1) orthogonal to the first direction. The ECO standard cell also includes fin cuts 142, 144, 146, 148, and 150 that cut the fins to separate the ECO standard cell into a first region 102, a second region 104, a third region 106, and a fourth region 108.

The first region 102 of the ECO standard cell includes metal diffusion (MD) layer interconnects 152 and 154 that connect fins 130, 132, and 134 together. In one configuration, the MD layer interconnect 152 is a contact for a pMOS transistor source of the pMOS transistor 192, and the MD layer interconnect 154 is a contact for a pMOS transistor drain of the pMOS transistor 192. In another configuration, the MD layer interconnect 152 is a contact for a pMOS transistor drain of the pMOS transistor 192 and the MD layer interconnect 154 is a contact for a pMOS transistor source of the pMOS transistor 192.

The first region 102 of the ECO standard cell includes MD layer interconnects 162 and 164 that connect fins 136, 138, and 140 together. In one configuration, the MD layer interconnect 162 is a contact for an nMOS transistor source of the nMOS transistor 194 and the MD layer interconnect 164 is a contact for an nMOS transistor drain of the nMOS transistor 194. In another configuration, the MD layer interconnect 162 is a contact for an nMOS transistor drain of the nMOS transistor 194 and the MD layer interconnect 164 is a contact for an nMOS transistor source of the nMOS transistor 194. The first region 102 may include a metal POLY (MP) layer interconnect 160 connecting the gate interconnect 112 to higher layers such as a V0 layer (to V0 vias) and the M1 layer (to M1 layer interconnects) of the ECO standard cell.

The fourth region 108 of the ECO standard cell includes MD layer interconnects 156 and 158 that connect fins 130, 132, and 134 together. In one configuration, the MD layer interconnect 158 is a contact for a pMOS transistor source of the pMOS transistor 196 and the MD layer interconnect 156 is a contact for a pMOS transistor drain of the pMOS transistor 196. In another configuration, the MD layer interconnect 158 is a contact for a pMOS transistor drain of the pMOS transistor 196 and the MD layer interconnect 156 is a contact for a pMOS transistor source of the pMOS transistor 196.

The fourth region 108 of the ECO standard cell includes MD layer interconnects 166 and 168 that connect fins 136, 138, and 140 together. In one configuration, the MD layer interconnect 168 is a contact for an nMOS transistor source of the nMOS transistor 198 and the MD layer interconnect 166 is a contact for an nMOS transistor drain of the nMOS transistor 198. In another configuration, the MD layer interconnect 168 is a contact for an nMOS transistor drain of the nMOS transistor 198 and the MD layer interconnect 166 is a contact for an nMOS transistor source of the nMOS transistor 198. The fourth region 108 includes an MP layer interconnect 170 connecting the gate interconnect 122 to higher layers such as a V0 layer (to V0 vias) and the M1 layer (to M1 layer interconnects) of the ECO standard cell.

Figure 2:
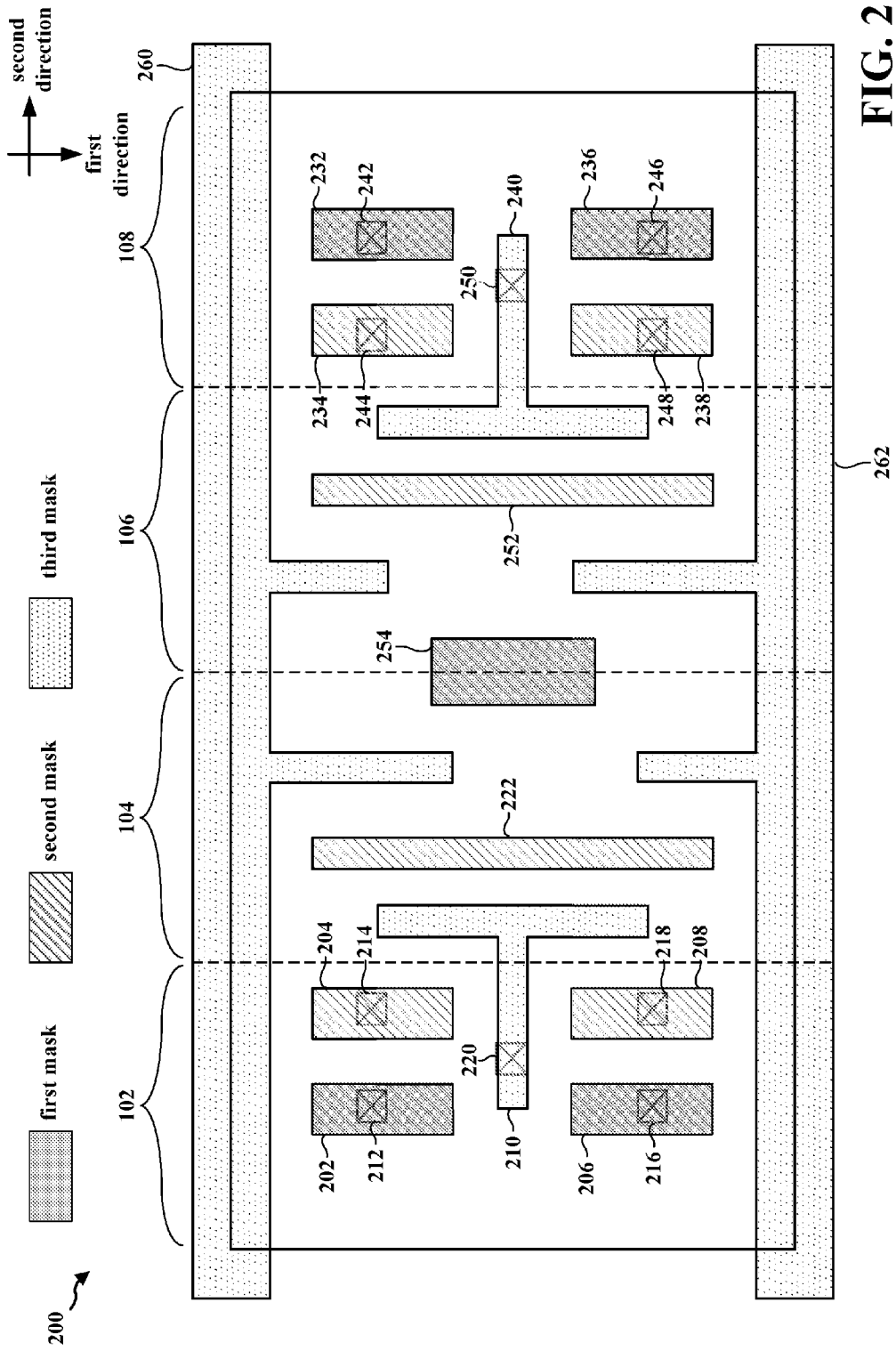
FIG. 2 is a diagram illustrating an exemplary layout of fixed M1 and V0 layers of the ECO standard cell described above in FIG. 1.

FIG. 2 is a diagram 200 illustrating an exemplary layout of fixed M1 and V0 layers of the ECO standard cell described above in FIG. 1. As shown, the ECO standard cell includes four regions 102, 104, 106, and 108. Because the M1 and V0 layers are fixed, masks for M1 and V0 layers are not changed upon an ECO. As described above, the M1 layer and below may be fixed and only layers higher than the M1 layer may be changed during an ECO.

The ECO standard cell includes an M1 layer interconnect 202 extending in the first region 102 in a first direction (e.g., vertical direction in FIG. 2). The ECO standard cell further includes a via V0 212 connecting the M1 layer interconnect 202 to the MD layer interconnect 152 of the FIG. 1.

The ECO standard cell includes an M1 layer interconnect 204 extending in the first region 102 in the first direction. The ECO standard cell further includes a via V0 214 connecting the M1 layer interconnect 204 to the MD layer interconnect 154 of the FIG. 1.

The ECO standard cell includes an M1 layer interconnect 206 extending in the first region 102 in the first direction. The ECO standard cell further includes a via V0 216 connecting the M1 layer interconnect 206 to the MD layer interconnect 162 of the FIG. 1.

The ECO standard cell includes an M1 layer interconnect 208 extending in the first region 102 in the first direction. The ECO standard cell further includes a via V0 218 connecting the M1 layer interconnect 208 to the MD layer interconnect 164 of the FIG. 1.

The ECO standard cell includes an M1 layer interconnect 210 shaped like a "T" extending in the first region 102 and the second region 104. The M1 layer interconnect 210 extends in a second direction (e.g., horizontal direction in FIG. 2) orthogonal to the first direction in the first region 102. The M1 layer interconnect 210 extends primarily in the first direction in the second region 104. The ECO standard cell further includes a via V0 220 connecting the M1 layer interconnect 210 to the MP layer interconnect 160 of the FIG. 1.

The ECO standard cell includes an M1 layer interconnect 222 extending in the first direction in the second region 104. The ECO standard cell includes an M1 layer interconnect 260 extending in the second direction in the regions 102, 104, 106, and 108. The M1 layer interconnect 260 may be coupled to a first voltage source (e.g., Vdd). The ECO standard cell includes an M1 layer interconnect 262 extending in the second direction in the regions 102, 104, 106, and 108. The M1 layer interconnect 262 may be coupled to a second voltage source (e.g., Vss). The second voltage source may have a voltage less than the first voltage source. For example, Vss may be a ground voltage and Vdd may be a voltage greater than zero.

In one configuration, the M1 layer interconnect 202 and the M1 layer interconnect 206 may be formed by a first mask. The M1 layer interconnect 204, the M1 layer interconnect 208, and the M1 layer interconnect 222 may be formed by a second mask different than the first mask. The M1 layer interconnect 210, the M1 layer interconnect 260, and the M1 layer interconnect 262 may be formed by a third mask. The third mask may be different from the first mask and the second mask.

The ECO standard cell includes an M1 layer interconnect 232 extending in the fourth region 108 in the first direction. The ECO standard cell further includes a via V0 242 connecting the M1 layer interconnect 232 to the MD layer interconnect 158 of the FIG. 1.

The ECO standard cell includes an M1 layer interconnect 234 extending in the fourth region 108 in the first direction. The ECO standard cell further includes a via V0 244 connecting the M1 layer interconnect 234 to the MD layer interconnect 156 of the FIG. 1.

The ECO standard cell includes an M1 layer interconnect 236 extending in the fourth region 108 in the first direction. The ECO standard cell further includes a via V0 246 connecting the M1 layer interconnect 236 to the MD layer interconnect 168 of the FIG. 1.

The ECO standard cell includes an M1 layer interconnect 238 extending in the fourth region 108 in the first direction. The ECO standard cell further includes a via V0 248 connecting the M1 layer interconnect 238 to the MD layer interconnect 166 of the FIG. 1.

The ECO standard cell includes an M1 layer interconnect 240 shaped like a "T" extending in the third region 106 and the fourth region 108. The M1 layer interconnect 240 extends in the second direction in the fourth region 108. The M1 layer interconnect 240 extends primarily in the first direction in the third region 106. The ECO standard cell further includes a via V0 250 connecting the M1 layer interconnect 240 to the MP layer interconnect 170 of the FIG. 1. The ECO standard cell includes an M1 layer interconnect 252 extending in the first direction in the third region 106.

In one configuration, the M1 layer interconnect 232 and the M1 layer interconnect 236 may be formed by a first mask. The M1 layer interconnect 234, the M1 layer interconnect 238, and the M1 layer interconnect 252 may be formed by a second mask different than the first mask. The M1 layer interconnect 240, the M1 layer interconnect 260, and the M1 layer interconnect 262 may be formed by a third mask. The third mask may be different from the first mask and the second mask.

The ECO standard cell may include an M1 layer interconnect 254 extending in the first direction between the second region 104 and the third region 106. The M1 layer interconnect 254 may be formed by a different mask than the M1 layer interconnects 210, 240, 260, or 262. For example and in one configuration, the M1 layer interconnect 254 may be formed by the same mask (e.g., the first mask) as the M1 layer interconnects 202, 206, 232, or 236. In another configuration, the M1 layer interconnect 254 may be formed by the same mask (e.g., the second mask) as the M1 layer interconnects 204, 208, 222, 234, 238, or 252.

Figure 3:
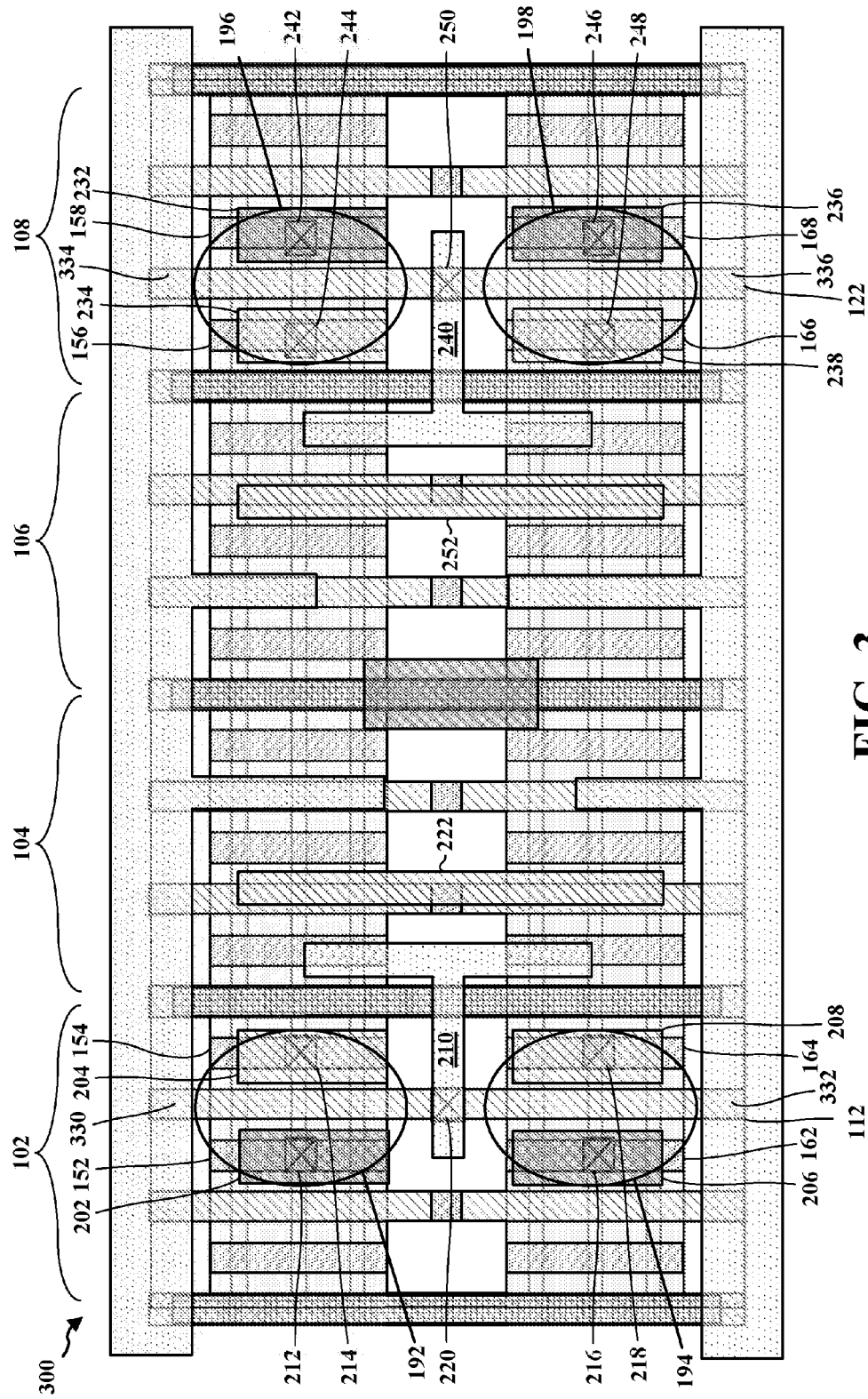
FIG. 3 is a diagram illustrating an exemplary layout of fixed base, M1, and V0 layers of the ECO standard cell described above in FIGS. 1 and 2.

FIG. 3 is a diagram 300 illustrating an exemplary layout of fixed base, M1, and V0 layers of the ECO standard cell described above in FIGS. 1 and 2. As shown, the ECO standard cell includes four regions 102, 104, 106, and 108. Because the base, M1, and V0 layers are fixed, the masks for base, M1, and V0 layers are not changed upon an ECO. As described above, the M1 layer and below may be fixed and only layers higher than the M1 layer may be changed during an ECO.

In this exemplary layout, the MD layer interconnect 152 is connected to the M1 layer interconnect 202 through the via V0 212. The MD layer interconnect 154 is connected to the M1 layer interconnect 204 through the via V0 214. The MD layer interconnect 162 is connected to the M1 layer interconnect 206 through the via V0 216. The MD layer interconnect 164 is connected to the M1 layer interconnect 208 through the via V0 218. The gate interconnect 112 is coupled to the M1 layer interconnect 210 through the via V0 220 and the MP layer interconnect 160 of FIG. 1.

The MD layer interconnect 158 is connected to the M1 layer interconnect 232 through the via V0 242. The MD layer interconnect 156 is connected to the M1 layer interconnect 234 through the via V0 244. The MD layer interconnect 168 is connected to the M1 layer interconnect 236 through the via V0 246. The MD layer interconnect 166 is connected to the M1 layer interconnect 238 through the via V0 248. The gate interconnect 122 is coupled to the M1 layer interconnect 240 through the via V0 250 and the MP layer interconnect 170 of FIG. 1. The M1 layer interconnects 222 and 252 are not connected to any components/interconnects of the base layers.

The ECO standard cell may include several pMOS transistors and several nMOS transistors in the first region 102. For example and in one configuration, the ECO standard cell includes a pMOS transistor 192 in the first region 102 having a pMOS transistor gate 330, a pMOS transistor source 152, and a pMOS transistor drain 154. The pMOS transistor gate 330 may be formed by a part of the gate interconnect 112. In another configuration, the pMOS transistor 192 may have the pMOS transistor gate 330, a pMOS transistor source 154, and a pMOS transistor drain 152.

In one configuration, the ECO standard cell includes an nMOS transistor 194 in the first region 102 having an nMOS transistor gate 332, an nMOS transistor source 162, and an nMOS transistor drain 164. The nMOS transistor gate 332 may be formed by a part of the gate interconnect 112. In another configuration, the nMOS transistor 194 may have the nMOS transistor gate 332, an nMOS transistor source 164, and an nMOS transistor drain 162. The ECO standard cell includes several unutilized pMOS transistors and several unutilized nMOS transistors in the second region 104 and the third region 106.

The ECO standard cell may include several pMOS transistors and several nMOS transistors in the fourth region 108. For example and in one configuration, the ECO standard cell includes a pMOS transistor 196 in the fourth region 108 having a pMOS transistor gate 334, a pMOS transistor source 158, and a pMOS transistor drain 156. The pMOS transistor gate 334 may be formed by a part of the gate interconnect 122. In another configuration, the pMOS transistor 196 may have the pMOS transistor gate 334, a pMOS transistor source 156, and a pMOS transistor drain 158.

In one configuration, the ECO standard cell includes an nMOS transistor 198 in the fourth region 108 having an nMOS transistor gate 336, an nMOS transistor source 168, and an nMOS transistor drain 166. The nMOS transistor gate 336 may be formed by a part of the gate interconnect 122. In another configuration, the nMOS transistor 198 may have the nMOS transistor gate 336, an nMOS transistor source 166, and an nMOS transistor drain 168.

Figure 4:
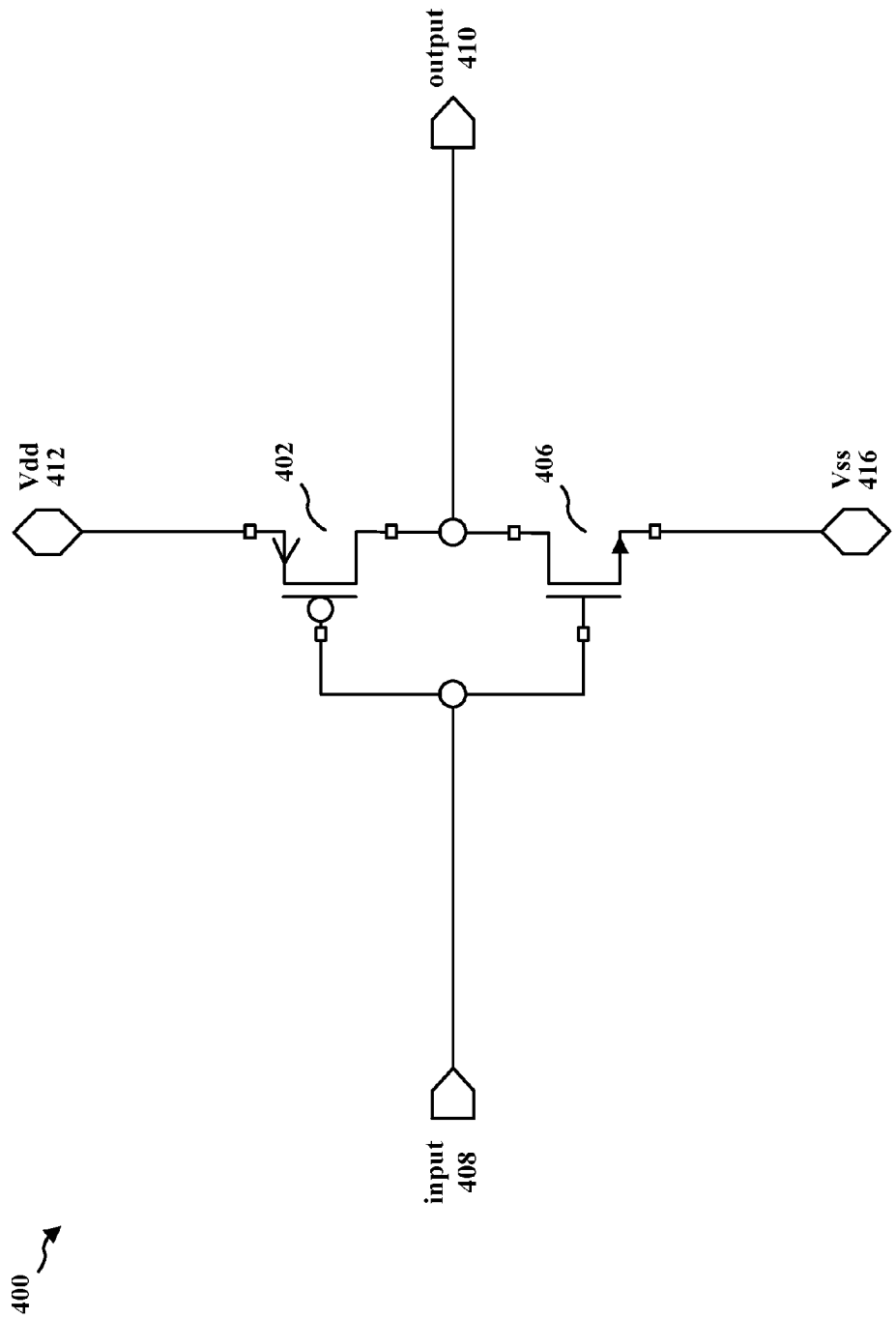
FIG. 4 is circuit diagram of an example of an inverter.

FIG. 4 is circuit diagram of an example of an inverter 400. In this example, the inverter 400 includes a pMOS transistor 402 connected in series with an nMOS transistor 406. An input 408 of the inverter 400 is connected to the gates of the pMOS transistor 402 and the nMOS transistor 406. The drains of the pMOS transistor 402 and the nMOS transistor 406 are connected to an output 410 of the inverter 400. The source of the pMOS transistor 402 is connected to a first power source (e.g., Vdd 412). The source of the nMOS transistor 406 is connected to a second power source (e.g., Vss 416) that is less than the first power source.

The pMOS transistor 402 and the nMOS transistor 406 may be FinFETs. The pMOS transistor 402 and the nMOS transistor 406 may be constructed with a shared gate interconnect that forms the gates of the pMOS transistor 402 and the nMOS transistor 406. A FinFET may also be referred to as a multiple gate field-effect transistor (FET) (MuGFET), a tri-gate FET, or a multi-gate FET. When two gates of a MuGFET are tied together, such a device may be referred to as a shorted-gate FinFET or tied-gate FinFET.

Figure 5:
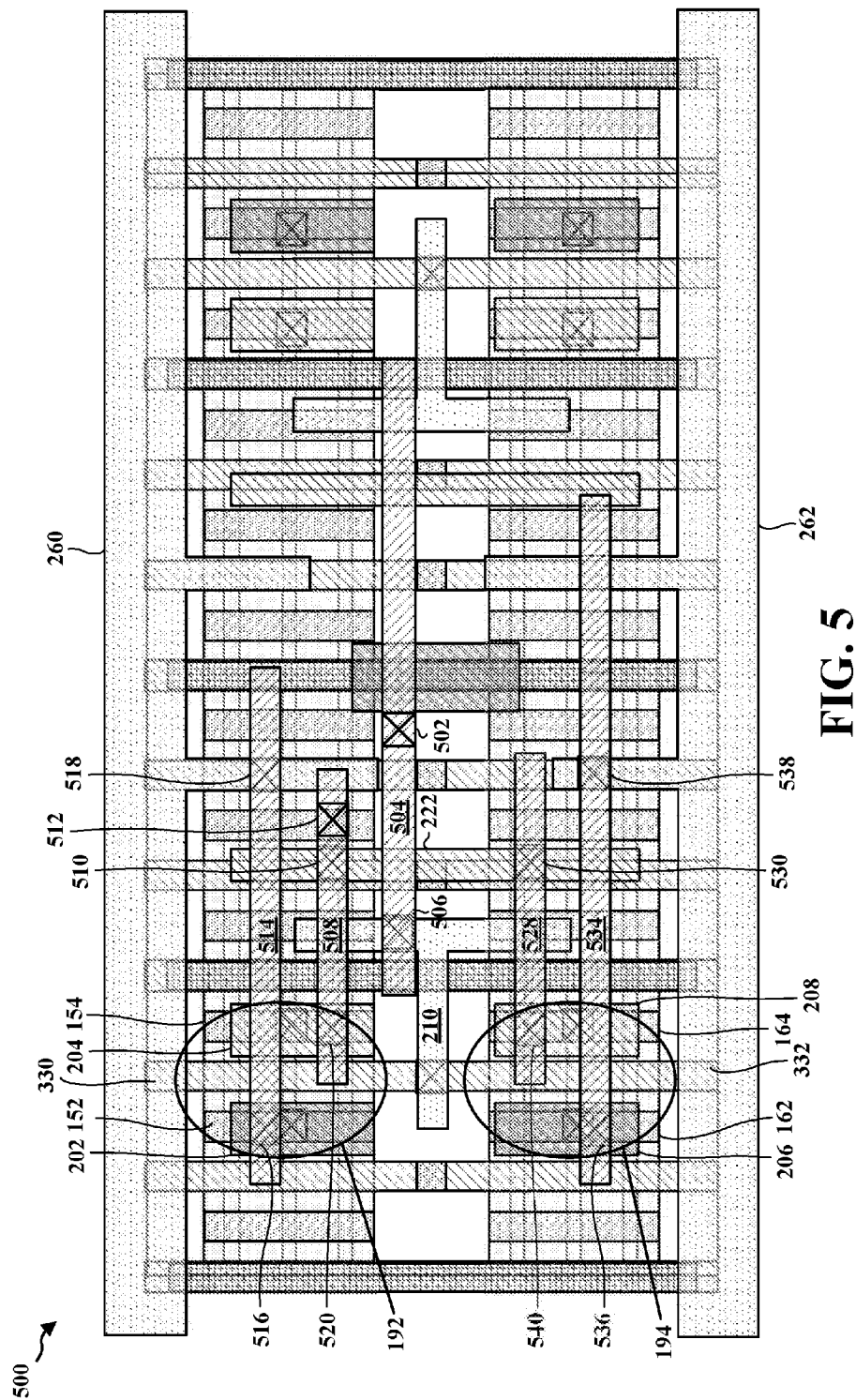
FIG. 5 is a diagram illustrating an example of the ECO standard cell described above in FIGS. 1-3.

FIG. 5 is a diagram 500 illustrating an example of the ECO standard cell described above in FIGS. 1-3. Specifically, this figure illustrates the ECO standard cell described above with respect to FIGS. 1-3 with V1 and higher layers configured to provide the inverter 400 of FIG. 4. The pMOS transistor 192 of the ECO standard cell corresponds to the pMOS transistor 402 of FIG. 4 and the nMOS transistor 194 of the ECO standard cell corresponds to the nMOS transistor 406 of FIG. 4.

The ECO standard cell includes an interconnect 504 at a metal layer above the fixed M1 layer (e.g., M2 layer). The interconnect 504 is connected to an input 502 corresponding to the input 408 of FIG. 4. The interconnect 504 is also coupled to the M1 layer interconnect 210 through a via 506. Because the M1 layer interconnect 210 is coupled to the pMOS transistor gate 330 of the pMOS transistor 192 and the nMOS transistor gate 332 of the nMOS transistor 194, the input 502 is coupled to the pMOS transistor gate 330 and the nMOS transistor gate 332 through the interconnect 504 and the M1 layer interconnect 210.

The ECO standard cell further includes an interconnect 514 at a metal layer above the fixed M1 layer (e.g., M2 layer). The interconnect 514 is coupled to the M1 layer interconnect 260 through a via 518. The interconnect 514 is also coupled to the M1 layer interconnect 202 through a via 516. Because the M1 layer interconnect 202 is coupled to the pMOS transistor source 152 of the pMOS transistor 192, and because the M1 layer interconnect 260 is coupled to Vdd, the pMOS transistor source 152 is coupled to Vdd through the M1 layer interconnect 202 and the interconnect 514.

The ECO standard cell further includes an interconnect 534 at a metal layer above the fixed M1 layer (e.g., M2 layer). The interconnect 534 is coupled to the M1 layer interconnect 262 through a via 538. The interconnect 534 is also coupled to the M1 layer interconnect 206 through a via 536. Because the M1 layer interconnect 206 is coupled to the nMOS transistor source 162 of the nMOS transistor 194, and because the M1 layer interconnect 262 is coupled to Vss, the nMOS transistor source 162 is coupled to Vss through the M1 layer interconnect 206 and the interconnect 534.

The ECO standard cell further includes an interconnect 508 at a metal layer above the fixed M1 layer (e.g., M2 layer). The interconnect 508 is connected to an output 512 corresponding to the output 410 of FIG. 4. The interconnect 508 is also coupled to the M1 layer interconnect 204 through a via 520. The ECO standard cell further includes an interconnect 528 at a metal layer above the fixed M1 layer (e.g., M2 layer). The interconnect 528 is coupled to the M1 layer interconnect 208 through a via 540. The M1 layer interconnect 222 is coupled to the interconnect 508 through a via 510. The M1 layer interconnect 222 is also coupled to the interconnect 528 through a via 530. Because the M1 layer interconnect 204 is coupled to the pMOS transistor drain 154 of the pMOS transistor 192, and because the M1 layer interconnect 208 is coupled to the nMOS transistor drain 164 of the nMOS transistor 194, the pMOS transistor drain 154 and the nMOS transistor drain 164 are coupled to the output 512 through the interconnects 508, 528, and the M1 layer interconnect 222.

Figure 6:
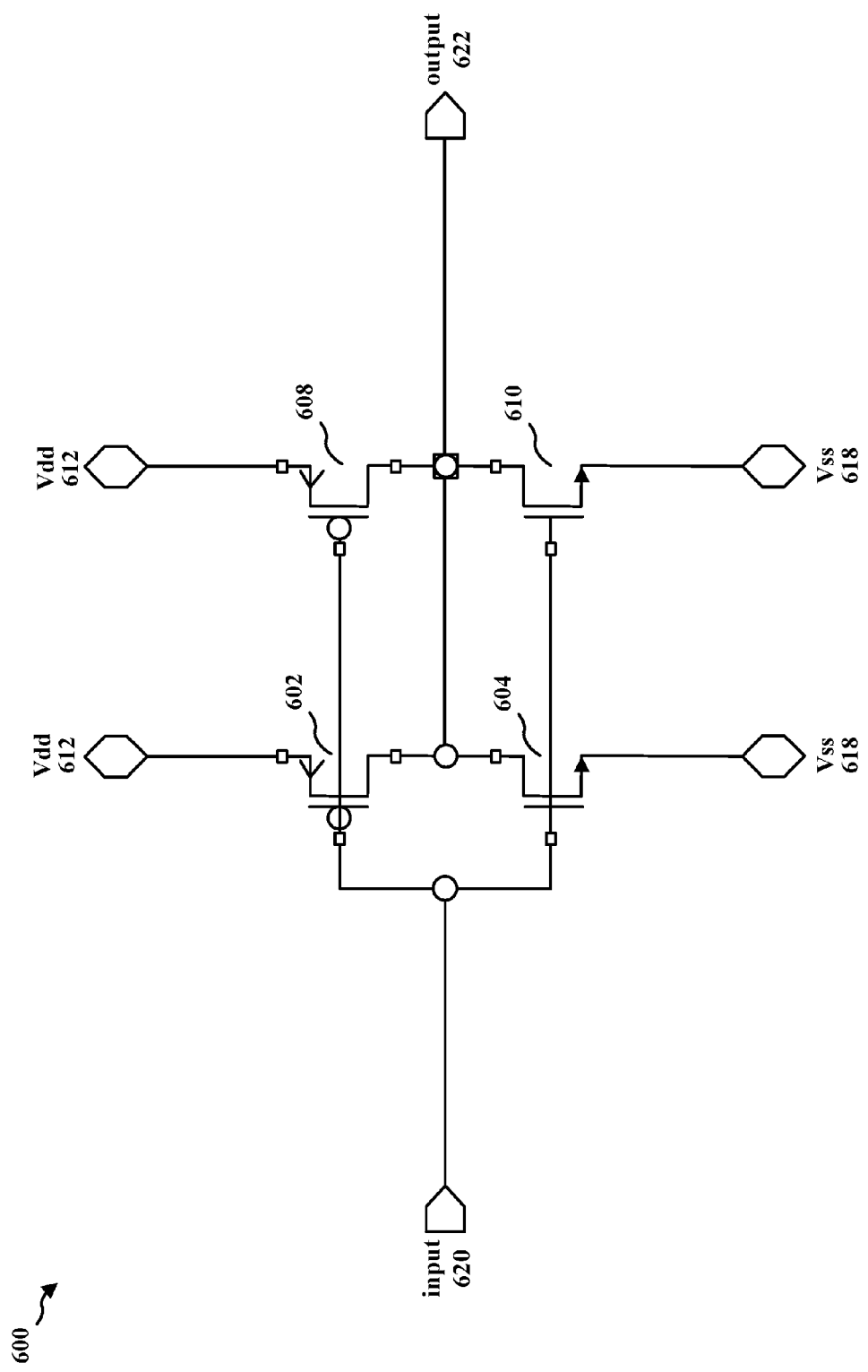
FIG. 6 is circuit diagram of an example of an inverter.

FIG. 6 is circuit diagram of an example of an inverter 600. In this example, the inverter 600 includes a pMOS transistor 602 connected in series with an nMOS transistor 604. The inverter 600 also includes a pMOS transistor 608 connected in series with an nMOS transistor 610. An input 620 of the inverter 600 is connected to the gates of the pMOS transistor 602, the nMOS transistor 604, the pMOS transistor 608, and the nMOS transistor 610. The drains of the pMOS transistor 602, the nMOS transistor 604, the pMOS transistor 608, and the nMOS transistor 610 are connected to an output 622 of the inverter 600. The sources of the pMOS transistor 602 and the pMOS transistor 608 are connected to a first power source (e.g., Vdd 612). The sources of the nMOS transistor 604 and the nMOS transistor 610 are connected to a second power source (e.g., Vss 618) that is less than the first power source.

The pMOS transistor 602, the nMOS transistor 604, the pMOS transistor 608, and the nMOS transistor 610 may be FinFETs. The pMOS transistor 602 and the nMOS transistor 604 may be constructed with a shared gate interconnect that forms the gates of the pMOS transistor 602 and the nMOS transistor 604. The pMOS transistor 608 and the nMOS transistor 610 may be constructed with a shared gate interconnect that forms the gates of the pMOS transistor 608 and the nMOS transistor 610.

Figure 7:
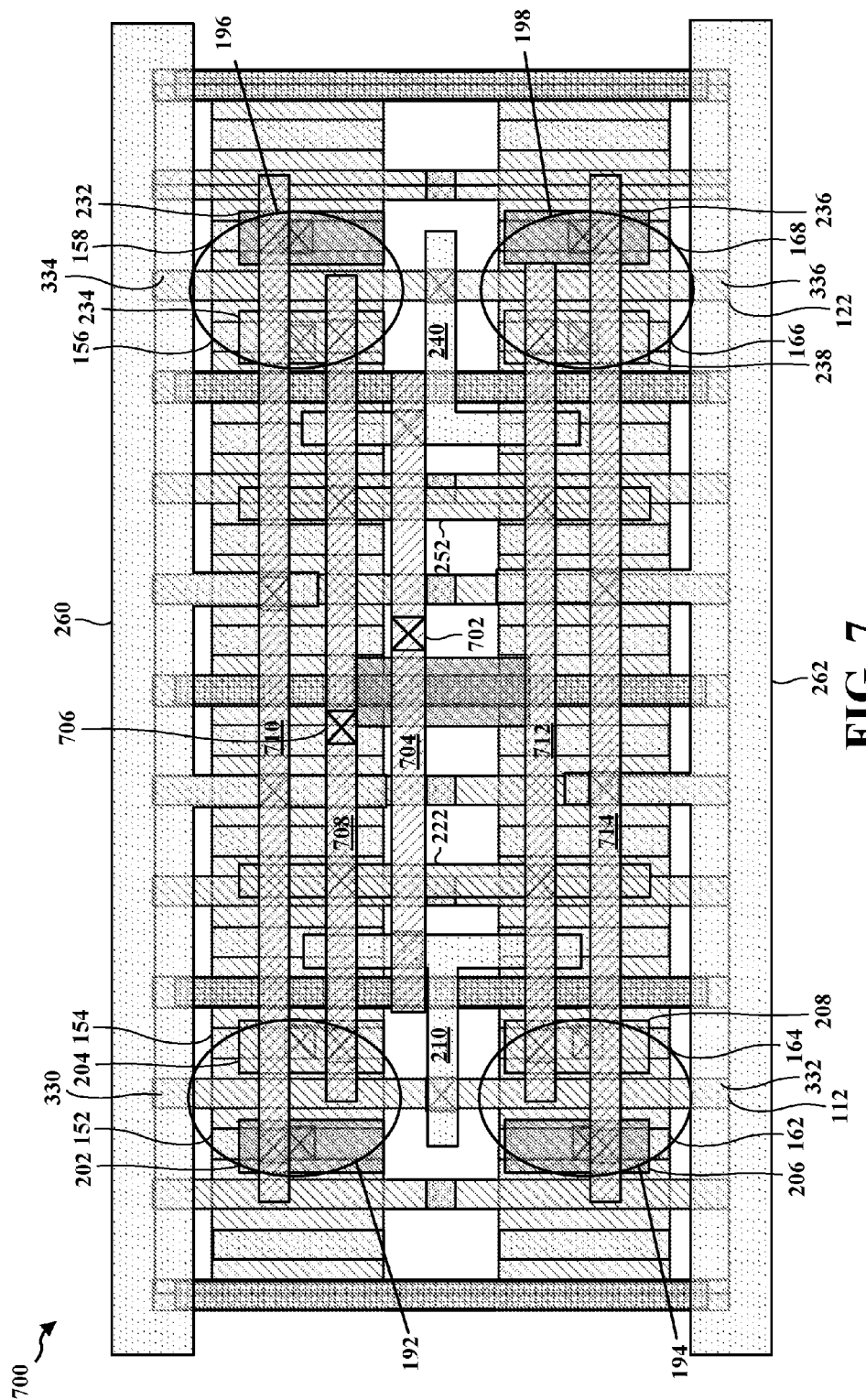
FIG. 7 is a diagram illustrating an example of the ECO standard cell described above in FIGS. 1-3.

FIG. 7 is a diagram 700 illustrating an example of the ECO standard cell described above in FIGS. 1-3. Specifically, this figure illustrates the ECO standard cell described above with respect to FIGS. 1-3 with V1 and higher layers configured to provide the inverter 600 of FIG. 6. The pMOS transistor 192 of the ECO standard cell corresponds to the pMOS transistor 602 of FIG. 6. The nMOS transistor 194 of the ECO standard cell corresponds to the nMOS transistor 604 of FIG. 6. The pMOS transistor 196 of the ECO standard cell corresponds to the pMOS transistor 608 of FIG. 6. The nMOS transistor 198 of the ECO standard cell corresponds to the nMOS transistor 610 of FIG. 6.

The ECO standard cell includes an interconnect 704 at a metal layer above the fixed M1 layer (e.g., M2 layer). The interconnect 704 is coupled to the M1 layer interconnects 210 and 240. An input 702 corresponding to the input 620 of FIG. 6 is connected to the interconnect 704. Because the M1 layer interconnect 210 is coupled to the gate interconnect 112 and the M1 layer interconnect 240 is coupled to the gate interconnect 122, the input 702 is coupled to the pMOS transistor gate 330 of the pMOS transistor 192, the nMOS transistor gate 332 of the nMOS transistor 194, the pMOS transistor gate 334 of the pMOS transistor 196, and the nMOS transistor gate 336 of the nMOS transistor 198.

The ECO standard cell further includes an interconnect 710 at a metal layer above the fixed M1 layer (e.g., M2 layer). The interconnect 710 is coupled to the M1 layer interconnect 260. The interconnect 710 is also coupled to the M1 layer interconnects 202 and 232. Because the M1 layer interconnect 202 is coupled to the pMOS transistor source 152 of the pMOS transistor 192 and the M1 layer interconnect 232 is connected to the pMOS transistor source 158 of the pMOS transistor 196, and because the M1 layer interconnect 260 is coupled to Vdd, the pMOS transistor sources 152 and 158 are coupled to Vdd.

The ECO standard cell further includes an interconnect 714 at a metal layer above the fixed M1 layer (e.g., M2 layer). The interconnect 714 is coupled to the M1 layer interconnect 262. The interconnect 714 is also coupled to the M1 layer interconnects 206 and 236. Because the M1 layer interconnect 206 is coupled to the nMOS transistor source 162 of the nMOS transistor 194 and the M1 layer interconnect 236 is connected to the nMOS transistor source 168 of the nMOS transistor 198, and because the M1 layer interconnect 262 is coupled to Vss, the nMOS transistor sources 162 and 168 are coupled to Vss.

The ECO standard cell further includes an interconnect 708 at a metal layer above the fixed M1 layer (e.g., M2 layer). The interconnect 708 is coupled to the M1 layer interconnects 204 and 234. An output 706 corresponding to the output 622 of FIG. 6 is connected to the interconnect 708. The ECO standard cell further includes an interconnect 712 at a metal layer above the fixed M1 layer (e.g., M2 layer). The interconnect 712 is coupled to the M1 layer interconnects 208 and 238. The M1 layer interconnect 222 is coupled to the interconnects 708 and 712. The M1 layer interconnect 252 is also coupled to the interconnects 708 and 712. The pMOS transistor drain 154 of the pMOS transistor 192, the nMOS transistor drain 164 of the nMOS transistor 194, the pMOS transistor drain 156 of the pMOS transistor 196, and the nMOS transistor drain 166 of the nMOS transistor 198 are coupled to the output 706 through the interconnects 708, 712, and the M1 layer interconnects 204, 234, 208, 238, 222, and 252.

Figure 8:
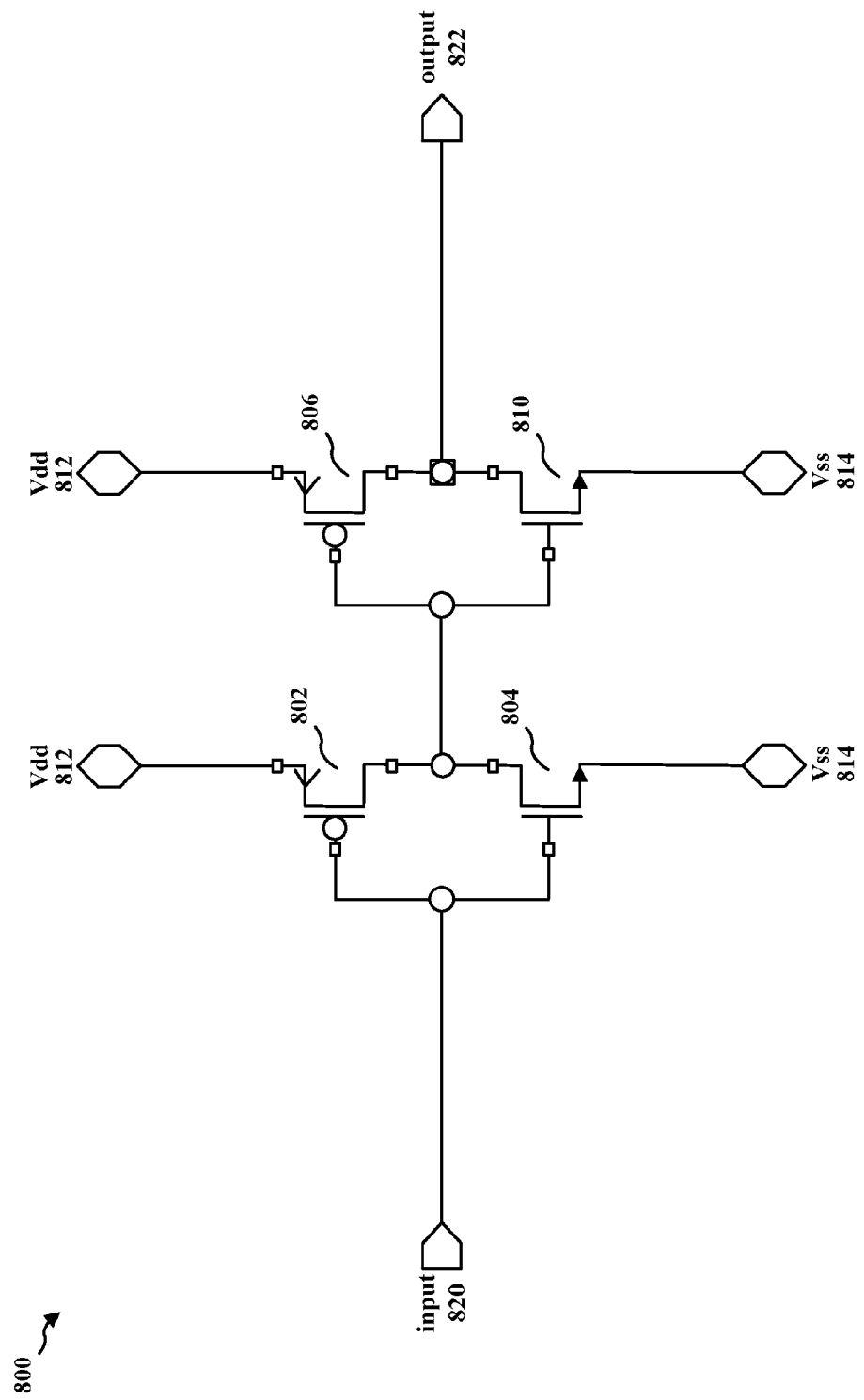
FIG. 8 is circuit diagram of an example of a buffer.

FIG. 8 is circuit diagram of an example of a buffer 800. In this example, the buffer 800 includes a pMOS transistor 802 connected in series with an nMOS transistor 804. The buffer 800 also includes a pMOS transistor 806 connected in series with an nMOS transistor 810. An input 820 of the buffer 800 is connected to the gates of the pMOS transistor 802 and the nMOS transistor 804. The drains of the pMOS transistor 806 and the nMOS transistor 810 are connected to an output 822 of the buffer 800. The drains of the pMOS transistor 802 and the nMOS transistor 804 are connected to the gates of the pMOS transistor 806 and the nMOS transistor 810. The sources of the pMOS transistor 802 and the pMOS transistor 806 are connected to a first power source (e.g., Vdd 812). The sources of the nMOS transistor 804 and the nMOS transistor 810 are connected to a second power source (e.g., Vss 814) that is less than the first power source.

The pMOS transistor 802, the nMOS transistor 804, the pMOS transistor 806, and the nMOS transistor 810 may be FinFETs. The pMOS transistor 802 and the nMOS transistor 804 may be constructed with a shared gate interconnect that forms the gates of the pMOS transistor 802 and the nMOS transistor 804. The pMOS transistor 806 and the nMOS transistor 810 may be constructed with a shared gate interconnect that forms the gates of the pMOS transistor 806 and the nMOS transistor 810.

Figure 9:
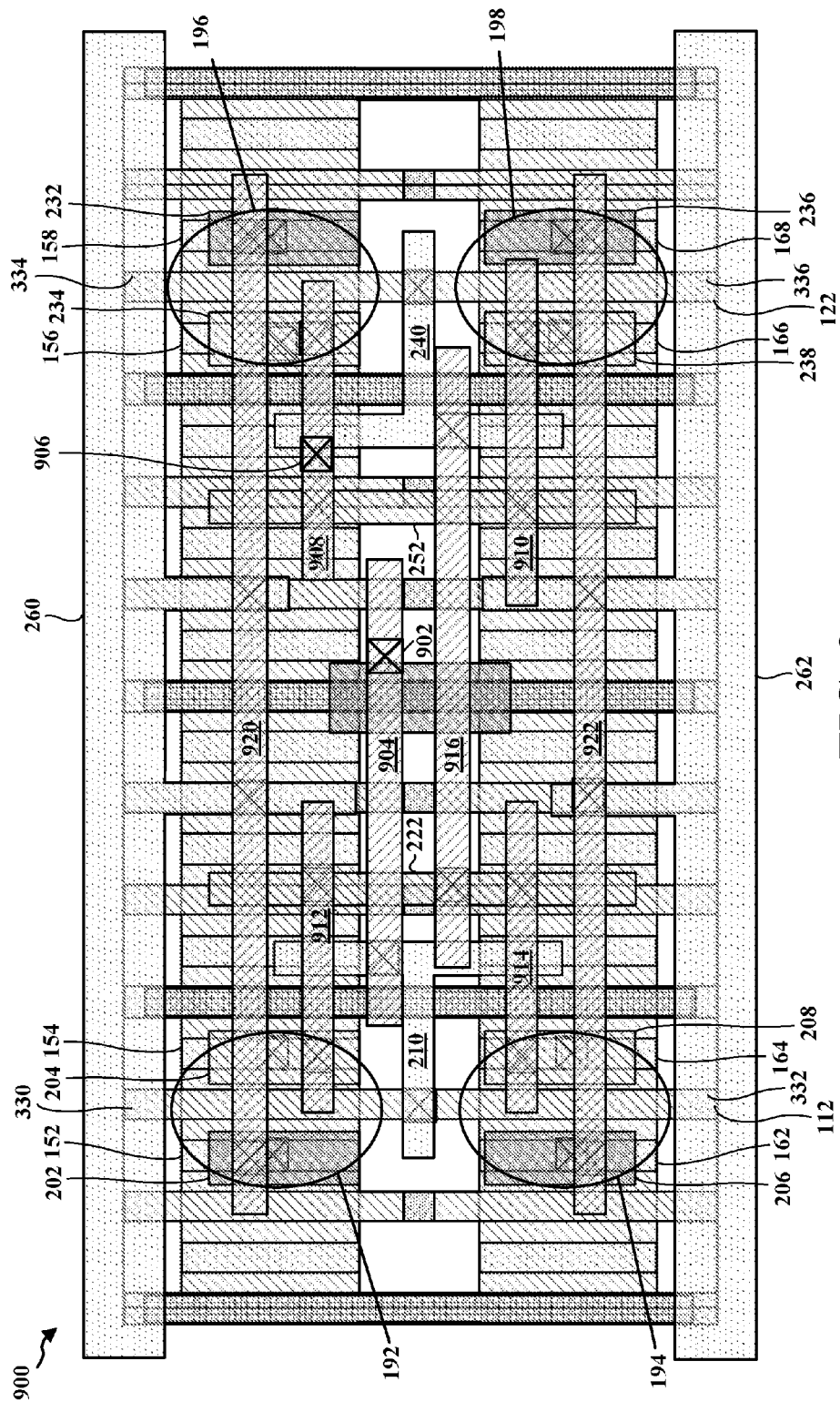
FIG. 9 is a diagram illustrating an example of the ECO standard cell described above in FIGS. 1-3.

FIG. 9 is a diagram 900 illustrating an example of the ECO standard cell described above in FIGS. 1-3. Specifically, this figure illustrates the ECO standard cell described above with respect to FIGS. 1-3 with V1 and higher layers configured to provide the buffer 800 of FIG. 8. The pMOS transistor 192 of the ECO standard cell corresponds to the pMOS transistor 802 of FIG. 8. The nMOS transistor 194 of the ECO standard cell corresponds to the nMOS transistor 804 of FIG. 8. The pMOS transistor 196 of the ECO standard cell corresponds to the pMOS transistor 806 of FIG. 8. The nMOS transistor 198 of the ECO standard cell corresponds to the nMOS transistor 810 of FIG. 8.

The ECO standard cell includes an interconnect 904 at a metal layer above the fixed M1 layer (e.g., M2 layer). The interconnect 904 is connected to an input 902 corresponding to the input 820 of FIG. 8. The interconnect 904 is also coupled to the M1 layer interconnect 210. Because the M1 layer interconnect 210 is coupled to the gate interconnect 112, the input 902 is coupled to the pMOS transistor gate 330 of the pMOS transistor 192 and the nMOS transistor gate 332 of the nMOS transistor 194.

The ECO standard cell further includes an interconnect 920 at a metal layer above the fixed M1 layer (e.g., M2 layer). The interconnect 920 is coupled to the M1 layer interconnect 260. The interconnect 920 may be also coupled to the M1 layer interconnects 202 and 232. Because the M1 layer interconnect 202 is coupled to the pMOS transistor source 152 of the pMOS transistor 192 and the M1 layer interconnect 232 is connected to the pMOS transistor source 158 of the pMOS transistor 196, and because the M1 layer interconnect 260 is coupled to Vdd, the pMOS transistor sources 152 and 158 are coupled to Vdd.

The ECO standard cell further includes an interconnect 922 at a metal layer above the fixed M1 layer (e.g., M2 layer). The interconnect 922 is coupled to the M1 layer interconnect 262. The interconnect 922 is also coupled to the M1 layer interconnects 206 and 236. Because the M1 layer interconnect 206 is coupled to the nMOS transistor source 162 of the nMOS transistor 194 and the M1 layer interconnect 236 is coupled to the nMOS transistor source 168 of the nMOS transistor 198, and because the M1 layer interconnect 262 is coupled to Vss, the nMOS transistor sources 162 and 168 are coupled to Vss.

The ECO standard cell further includes an interconnect 912 at a metal layer above the fixed M1 layer (e.g., M2 layer). The interconnect 912 is coupled to the M1 layer interconnect 204. The ECO standard cell further includes an interconnect 914 at a metal layer above the fixed M1 layer (e.g., M2 layer). The interconnect 914 is coupled to the M1 layer interconnect 208. The interconnects 912 and 914 are coupled to the M1 layer interconnect 222. Because the M1 layer interconnect 204 is coupled to the pMOS transistor drain 154 of the pMOS transistor 192 and the M1 layer interconnect 208 is coupled to the nMOS transistor drain 164 of the nMOS transistor 194, the pMOS transistor drain 154 and the nMOS transistor drain 164 are coupled to the M1 layer interconnect 222.

The ECO standard cell further includes an interconnect 916 at a metal layer above the fixed M1 layer (e.g., M2 layer). The interconnect 916 is coupled to the M1 layer interconnect 222 and the M1 layer interconnect 240. Because the M1 layer interconnect 222 is coupled to the pMOS transistor drain 154 and the nMOS transistor drain 164, and because the M1 layer interconnect 240 is coupled to the gate interconnect 122, the pMOS transistor drain 154 and the nMOS transistor drain 164 are connected to the pMOS transistor gate 334 and the nMOS transistor gate 336.

The ECO standard cell further includes an interconnect 908 at a metal layer above the fixed M1 layer (e.g., M2 layer). The interconnect 908 is coupled to the M1 layer interconnects 234 and 252. The interconnect 908 is also connected to an output 906 corresponding to the output 822 of FIG. 8. The ECO standard cell further includes an interconnect 910 at a metal layer above the fixed M1 layer (e.g., M2 layer). The interconnect 910 is coupled to the M1 layer interconnects 238 and 252. Because the M1 layer interconnect 234 is coupled to the pMOS transistor drain 156 of the pMOS transistor 196 and the M1 layer interconnect 238 is coupled to the nMOS transistor drain 166 of the nMOS transistor 198, the pMOS transistor drain 156 and the nMOS transistor drain 166 are coupled to the M1 layer interconnect 252, which is coupled to the output 906 through the interconnect 908. Thus, the pMOS transistor drain 156 and the nMOS transistor drain 166 are coupled to the output 906.

Figure 10:
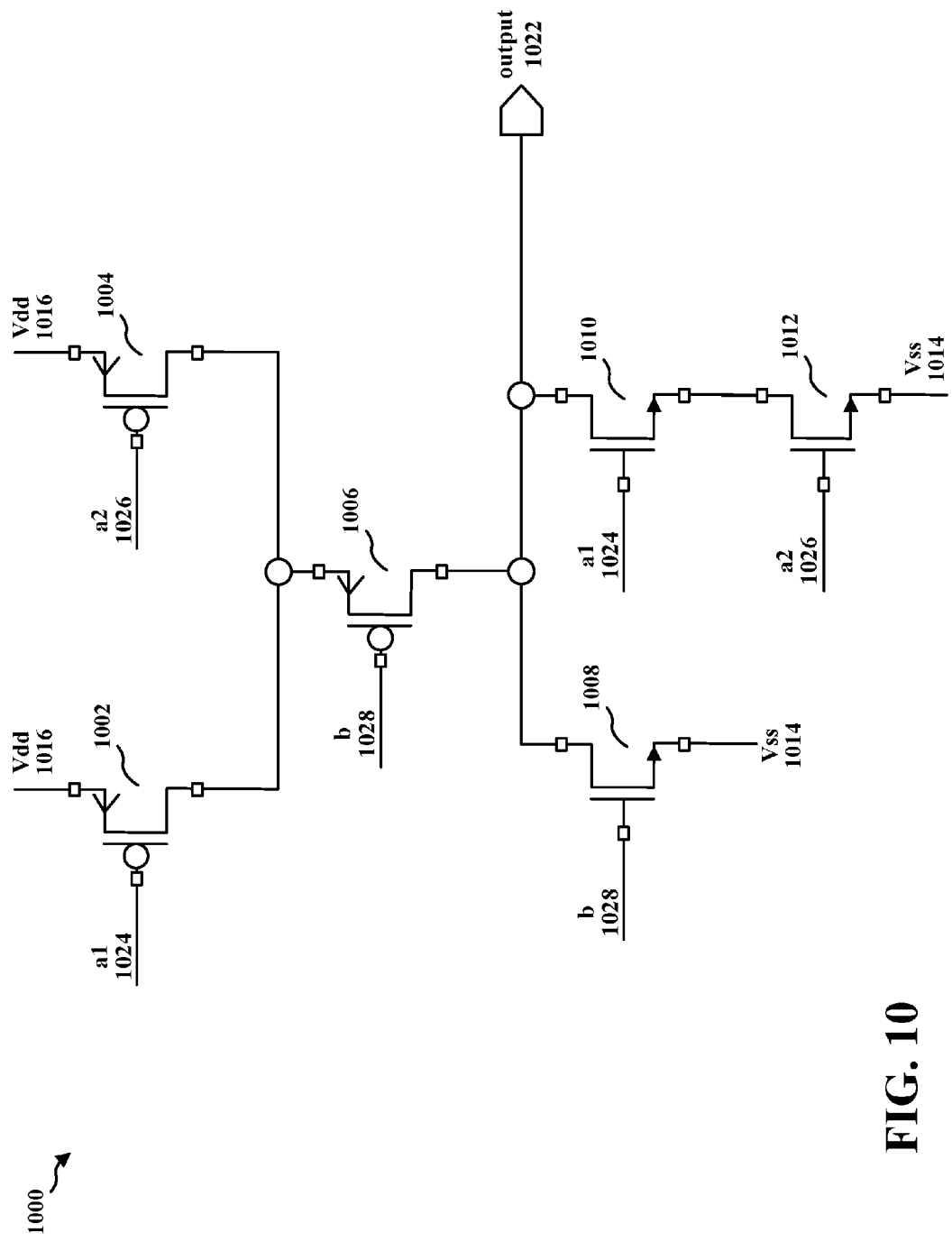
FIG. 10 is circuit diagram of an example of AOI logic gates.

FIG. 10 is circuit diagram of an example of AND-OR-invert (AOI) logic gates 1000. In this example, the AOI logic gates 1000 include a pMOS transistor 1002, a pMOS transistor 1004, a pMOS transistor 1006, an nMOS transistor 1008, an nMOS transistor 1010, and an nMOS transistor 1012. The pMOS transistor 1002, the pMOS transistor 1004, the pMOS transistor 1006, the nMOS transistor 1008, the nMOS transistor 1010, and the nMOS transistor 1012 may be FinFETs. The drains of the pMOS transistor 1002 and the pMOS transistor 1004 are connected to the source of the pMOS transistor 1006. The drain of the pMOS transistor 1006 is connected to the drains of the nMOS transistor 1008 and the nMOS transistor 1010. The source of the nMOS transistor 1010 is connected to the drain of the nMOS transistor 1012.

An input a1 1024 of the AOI logic gates 1000 is connected to the gates of the pMOS transistor 1002 and the nMOS transistor 1010. An input a2 1026 of the AOI logic gates 1000 is connected to the gates of the pMOS transistor 1004 and the nMOS transistor 1012. An input b 1028 of the AOI logic gates 1000 is connected to the gates of the pMOS transistor 1006 and the nMOS transistor 1008. The drains of the pMOS transistor 1006, the nMOS transistor 1008, and the nMOS transistor 1010 are connected to an output 1022 of the AOI logic gates 1000. The sources of the pMOS transistor 1002 and the pMOS transistor 1004 are connected to a first power source (e.g., Vdd 1016). The sources of the nMOS transistor 1008 and the nMOS transistor 1012 are connected to a second power source (e.g., Vss 1014) that is less than the first power source.

Figure 11:
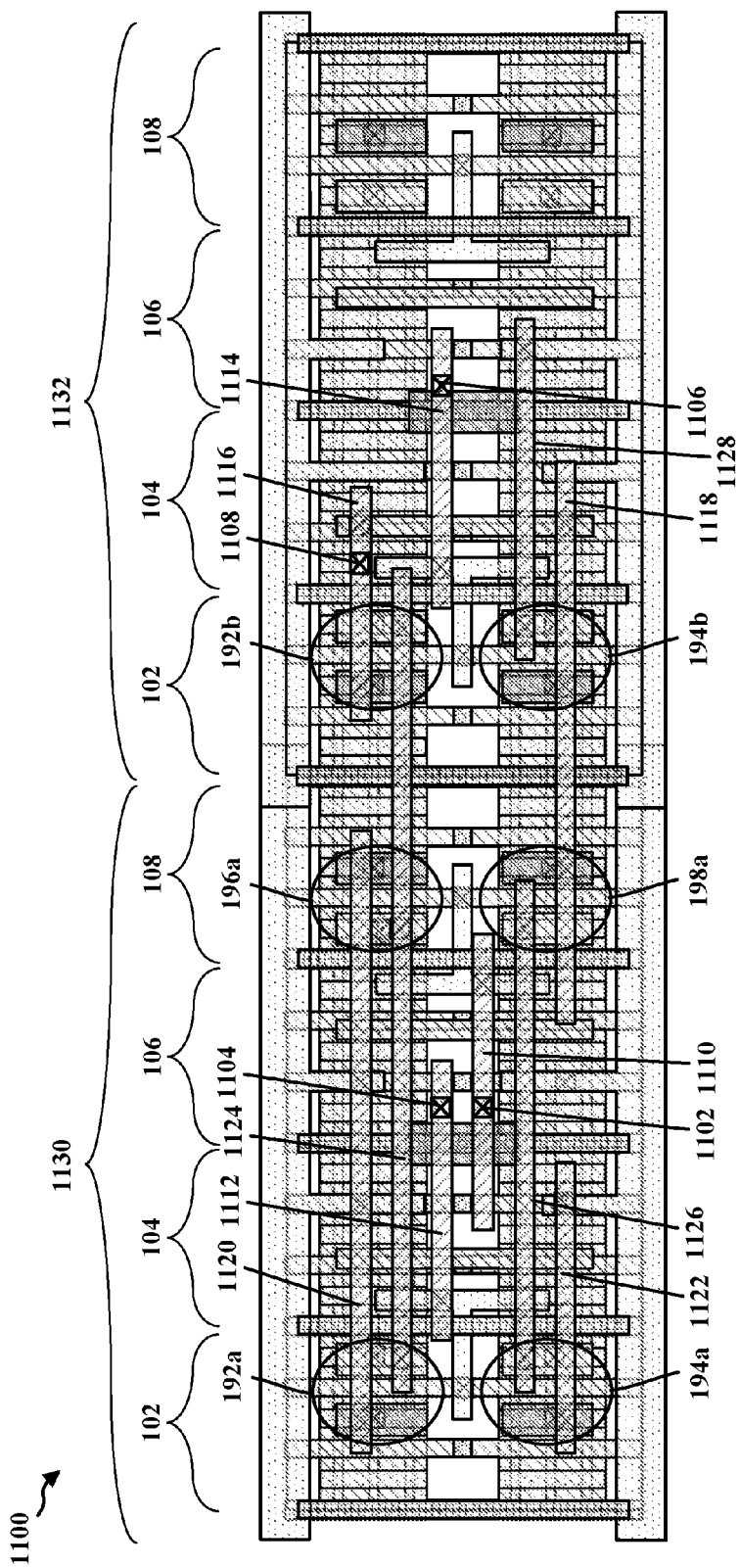
FIG. 11 is a diagram illustrating an example of the ECO standard cell described above in FIGS. 1-3.

FIG. 11 is a diagram 1100 illustrating an example of the ECO standard cell described above in FIGS. 1-3. Specifically, this figure illustrates the ECO standard cell described above with respect to FIGS. 1-3 with V1 and higher layers configured to provide the AOI logic gates 1000 of FIG. 10. In this example, two ECO standard cells 1130 and 1132 are used for constructing the AOI logic gates 1000. Each of the ECO standard cells 1130 and 1132 includes the first region 102, the second region 104, the third region 106, and the fourth region 108, as described above with references to FIGS. 1-3.

The pMOS transistor 192a of the ECO standard cell corresponds to the pMOS transistor 1004 of FIG. 10. The nMOS transistor 194a of the ECO standard cell corresponds to the nMOS transistor 1012 of FIG. 10. The pMOS transistor 196a of the ECO standard cell corresponds to the pMOS transistor 1002 of FIG. 10. The nMOS transistor 198a of the ECO standard cell corresponds to the nMOS transistor 1010 of FIG. 10. The pMOS transistor 192b of the ECO standard cell corresponds to the pMOS transistor 1006 of FIG. 10. The nMOS transistor 194b of the ECO standard cell corresponds to the nMOS transistor 1008 of FIG. 10.

An input 1102 corresponding to the input a1 1024 of FIG. 10 is coupled to the gates of the pMOS transistor 196a and the nMOS transistor 198a through an interconnect 1110 at a metal layer above the fixed M1 layer (e.g., M2 layer). An input 1104 corresponding to the input a2 1026 of FIG. 10 is coupled to the gates of the pMOS transistor 192a and the nMOS transistor 194a through an interconnect 1112 at a metal layer above the fixed M1 layer (e.g., M2 layer). An input 1106 corresponding to the input b 1028 of FIG. 10 is coupled to the gates of the pMOS transistor 192b and the nMOS transistor 194b through an interconnect 1114 at a metal layer above the fixed M1 layer (e.g., M2 layer). An output 1108 corresponding to the output 1022 of FIG. 10 is coupled to the pMOS transistor drain of the pMOS transistor 192b through an interconnect 1116 at a metal layer above the fixed M1 layer (e.g., M2 layer). The output 1108 is also coupled to the nMOS transistor drains of the nMOS transistors 194b and 198a through an interconnect 1118 at a metal layer above the fixed M1 layer (e.g., M2 layer).

The pMOS transistor sources of pMOS transistors 192a and 196a are coupled to Vdd through an interconnect 1120 at a metal layer above the fixed M1 layer (e.g., M2 layer). The nMOS transistor source of the nMOS transistor 194a is coupled to Vss through an interconnect 1122 at a metal layer above the fixed M1 layer (e.g., M2 layer). The nMOS transistor source of the nMOS transistor 194b is coupled to Vss through an interconnect 1128 at a metal layer above the fixed M1 layer (e.g., M2 layer).

The pMOS transistor drains of the pMOS transistors 192a and 196a are coupled to the pMOS transistor source of the pMOS transistor 192b through an interconnect 1124 at a metal layer above the fixed M1 layer (e.g., M2 layer). The nMOS transistor drain of the nMOS transistor 194a is coupled to the nMOS transistor source of the nMOS transistor 198a through an interconnect 1126 at a metal layer above the fixed M1 layer (e.g., M2 layer).

In one configuration, the ECO standard cell described above in FIGS. 1-11 is a MOS device including a plurality of regions (e.g., regions 102, 104, 106, and 108). The MOS device includes a first plurality of pMOS transistors (e.g., pMOS transistors associated with the gate interconnects 110 and 112) and a first plurality of nMOS transistors (e.g., nMOS transistors associated with the gate interconnects 110 and 112) in a first region (e.g., the first region 102) of the device. Each of the first plurality of pMOS transistors has fins (e.g., the fins 130, 132, and 134 in FIG. 1). Each of the first plurality of nMOS transistors has fins (e.g., the fins 136, 138, and 140). The first plurality of pMOS transistors include a first pMOS transistor (e.g., the pMOS transistor 192) having a first pMOS transistor gate (e.g., the pMOS transistor gate 330), a first pMOS transistor source (e.g., the pMOS transistor source 152), and a first pMOS transistor drain (e.g., the pMOS transistor drain 154). The first plurality of nMOS transistors include a first nMOS transistor (e.g., the nMOS transistor 194) having a first nMOS transistor gate (e.g., the nMOS transistor gate 332), a first nMOS transistor source (e.g., the nMOS transistor source 162), and a first nMOS transistor drain (e.g., the nMOS transistor drain 164). The first pMOS transistor gate and the first nMOS transistor gate are formed by a first gate interconnect (e.g., the gate interconnect 112) extending in a first direction (e.g., the vertical direction in FIG. 1) across the device.

In one configuration, the MOS device includes a second plurality of unutilized pMOS transistors (e.g., pMOS transistors associated with the gate interconnects 114 and 116) and a second plurality of unutilized nMOS transistors (e.g., nMOS transistors associated with the gate interconnects 114 and 116) in a second region (e.g., the second region 104) of the device. The second region is adjacent to the first region. Each of the second plurality of unutilized pMOS transistors has fins (e.g., the fins 130, 132, and 134). Each of the second plurality of unutilized nMOS transistors has fins (e.g., the fins 136, 138, and 140). The fins of the first plurality of pMOS transistors and the first plurality of nMOS transistors in the first region are disconnected (e.g., by the fin cut 144) from the fins of the second plurality of unutilized pMOS transistors and the second plurality of unutilized nMOS transistors in the second region.

In one configuration, the MOS device may further include a first M1 layer interconnect (e.g., the M1 layer interconnect 202) extending in the first region in the first direction. The first M1 layer interconnect may be coupled to the first pMOS transistor source. In one configuration, the MOS device may further include a second M1 layer interconnect (e.g., the M1 layer interconnect 204) extending in the first region in the first direction. The second M1 layer interconnect may be coupled to the first pMOS transistor drain. In one configuration, the MOS device may further include a third M1 layer interconnect (e.g., the M1 layer interconnect 206) extending in the first region in the first direction. The third M1 layer interconnect may be coupled to the first nMOS transistor source. In one configuration, the MOS device may further include a fourth M1 layer interconnect (e.g., the M1 layer interconnect 208) extending in the first region in the first direction. The fourth M1 layer interconnect may be coupled to the first nMOS transistor drain.

In one configuration, the MOS device may further include a fifth M1 layer interconnect (e.g., the M1 layer interconnect 210) extending in the first region and the second region. The fifth M1 layer interconnect may be coupled to the first gate interconnect. The fifth M1 layer interconnect may extend in a second direction (e.g., the horizontal direction in FIG. 2) orthogonal to the first direction in the first region. The fifth M1 layer interconnect may extend primarily in the first direction in the second region.

In one configuration, the MOS device may further include a sixth M1 layer interconnect (e.g., the M1 layer interconnect 222) extending in the first direction in the second region. In one configuration, the MOS device may further include a seventh M1 layer interconnect (e.g., the M1 layer interconnect 260) extending in the first region and the second region. The seventh M1 layer interconnect may be coupled to a first voltage source (e.g., Vdd). In one configuration, the MOS device may further include an eighth M1 layer interconnect (e.g., the M1 layer interconnect 262) extending in the first region and the second region. The eighth M1 layer interconnect may be coupled to a second voltage source (e.g., Vss). The second voltage source may have a voltage less than the first voltage source.

In one configuration, the first M1 layer interconnect and the third M1 layer interconnect may be formed by a first mask (e.g., the first mask describe above with reference to FIG. 2). The second M1 layer interconnect and the fourth M1 layer interconnect and the sixth M1 layer interconnect may be formed by a second mask (e.g., the second mask described above with reference to FIG. 2) different than the first mask. The fifth M1 layer interconnect, the seventh M1 layer interconnect, and the eighth M1 layer interconnect may be formed by a third mask (e.g., the third mask described above with reference to FIG. 2). The third mask may be different from the first mask and the second mask.

In one configuration, the second M1 layer interconnect and the fourth M1 layer interconnect may be formed by a first mask (e.g., the first mask describe above with reference to FIG. 2). The first M1 layer interconnect, the third M1 layer interconnect, and the sixth M1 layer interconnect may be formed by a second mask (e.g., the second mask described above with reference to FIG. 2) different than the first mask. The fifth M1 layer interconnect, the seventh M1 layer interconnect, and the eighth M1 layer interconnect may be formed by a third mask (e.g., the third mask described above with reference to FIG. 2). The third mask may be different from the first mask and the second mask.

In one configuration, the MOS device may further include a third plurality of unutilized pMOS transistors (e.g., the pMOS transistors associated with the gate interconnects 118 and 120) and a third plurality of unutilized nMOS transistors (e.g., the nMOS transistors associated with the gate interconnects 118 and 120) in a third region (e.g., the third region 106) of the device. The third region may be adjacent to the second region. Each of the third plurality of unutilized pMOS transistors may have fins (e.g., the fins 130, 132, and 134). Each of the third plurality of unutilized nMOS transistors may have fins (e.g., the fins 136, 138, and 140).

In one configuration, the MOS device may further include a fourth plurality of pMOS transistors (e.g., pMOS transistors associated with the gate interconnects 122 and 124) and a fourth plurality of nMOS transistors (e.g., nMOS transistors associated with the gate interconnects 122 and 124) in a fourth region (e.g., the fourth region 108) of the device. The fourth region may be adjacent to the third region. Each of the fourth plurality of pMOS transistors has fins (e.g., the fins 130, 132, and 134). Each of the fourth plurality of nMOS transistors has fins (e.g., the fins 136, 138, and 140). The fourth plurality of pMOS transistors may include a second pMOS transistor (e.g., the pMOS transistor 196) having a second pMOS transistor gate (e.g., the pMOS transistor gate 334), a second pMOS transistor source (e.g., the pMOS transistor source 158), and a second pMOS transistor drain (e.g., the pMOS transistor drain 156). The fourth plurality of nMOS transistors may include a second nMOS transistor (e.g., the nMOS transistor 198) having a second nMOS transistor gate (e.g., the nMOS transistor gate 336), a second nMOS transistor source (e.g., the nMOS transistor source 168), and a second nMOS transistor drain (e.g., the nMOS transistor drain 166). The second pMOS transistor gate and the second nMOS transistor gate may be formed by a second gate interconnect (e.g., the gate interconnect 122) extending in the first direction across the device.

In one configuration, fins of the third plurality of unutilized pMOS transistors and the third plurality of unutilized nMOS transistors in the third region may be disconnected (e.g., by the fin cut 148) from fins of the fourth plurality of pMOS transistors and the fourth plurality of nMOS transistors in the fourth region. In one configuration, fins of the third plurality of unutilized pMOS transistors and the third plurality of unutilized nMOS transistors in the third region may be disconnected (e.g., by the fin cut 146) from fins of the second plurality of unutilized pMOS transistors and the second plurality of unutilized nMOS transistors in the second region.

In one configuration, the MOS device may further include a first M1 layer interconnect (e.g., the M1 layer interconnect 232) extending in the fourth region in the first direction. The first M1 layer interconnect may be coupled to the second pMOS transistor source. In one configuration, the MOS device may further include a second M1 layer interconnect (e.g., the M1 layer interconnect 234) extending in the fourth region in the first direction. The second M1 layer interconnect may be coupled to the second pMOS transistor drain. In one configuration, the MOS device may further include a third M1 layer interconnect (e.g., the M1 layer interconnect 236) extending in the fourth region in the first direction. The third M1 layer interconnect may be coupled to the second nMOS transistor source. In one configuration, the MOS device may further include a fourth M1 layer interconnect (e.g., the M1 layer interconnect 238) extending in the fourth region in the first direction. The fourth M1 layer interconnect may be coupled to the second nMOS transistor drain.

In one configuration, the MOS device may further include a fifth M1 layer interconnect (e.g., the M1 layer interconnect 240) extending in the fourth region and the third region. The fifth M1 layer interconnect may be coupled to the second gate interconnect. The fifth M1 layer interconnect may extend in a second direction (e.g., the horizontal direction in FIG. 2) orthogonal to the first direction in the fourth region. The fifth M1 layer interconnect may extend primarily in the first direction in the third region.

In one configuration, the MOS device may further include a sixth M1 layer interconnect (e.g., the M1 layer interconnect 252) extending in the first direction in the third region. In one configuration, the MOS device may further include a seventh M1 layer interconnect (e.g., the M1 layer interconnect 260) extending in the first region, the second region, the third region, and the fourth region. The seventh M1 layer interconnect may be coupled to a first voltage source (e.g., Vdd). In one configuration, the MOS device may further include an eighth M1 layer interconnect (e.g., the M1 layer interconnect 262) extending in the first region, the second region, the third region, and the fourth region. The eighth M1 layer interconnect may be coupled to a second voltage source (e.g., Vss). The second voltage source may have a voltage less than the first voltage source.

In one configuration, the first M1 layer interconnect and the third M1 layer interconnect may be formed by a first mask (e.g., the first mask described above with reference to FIG. 2). The second M1 layer interconnect, the fourth M1 layer interconnect, and the sixth M1 layer interconnect may be formed by a second mask (e.g., the second mask described above with reference to FIG. 2) different than the first mask. The fifth M1 layer interconnect, the seventh M1 layer interconnect, and the eighth M1 layer interconnect may be formed by a third mask (e.g., the third mask described above with reference to FIG. 2). The third mask may be different from the first mask and the second mask.

In one configuration, the second M1 layer interconnect and the fourth M1 layer interconnect may be formed by a first mask (e.g., the first mask described above with reference to FIG. 2). The first M1 layer interconnect, the third M1 layer interconnect, and the sixth M1 layer interconnect may be formed by a second mask (e.g., the second mask described above with reference to FIG. 2) different than the first mask. The fifth M1 layer interconnect, the seventh M1 layer interconnect, and the eighth M1 layer interconnect may be formed by a third mask (e.g., the third mask described above with reference to FIG. 2). The third mask may be different from the first mask and the second mask.

In one configuration, the MOS device may further include a ninth M1 layer interconnect (e.g., the M1 layer interconnect 254) extending in the first direction between the second region and the third region. The ninth M1 layer interconnect may be formed by a different mask than the fifth M1 layer interconnect, the seventh M1 layer interconnect, and the eighth M1 layer interconnect.

Figure 12:
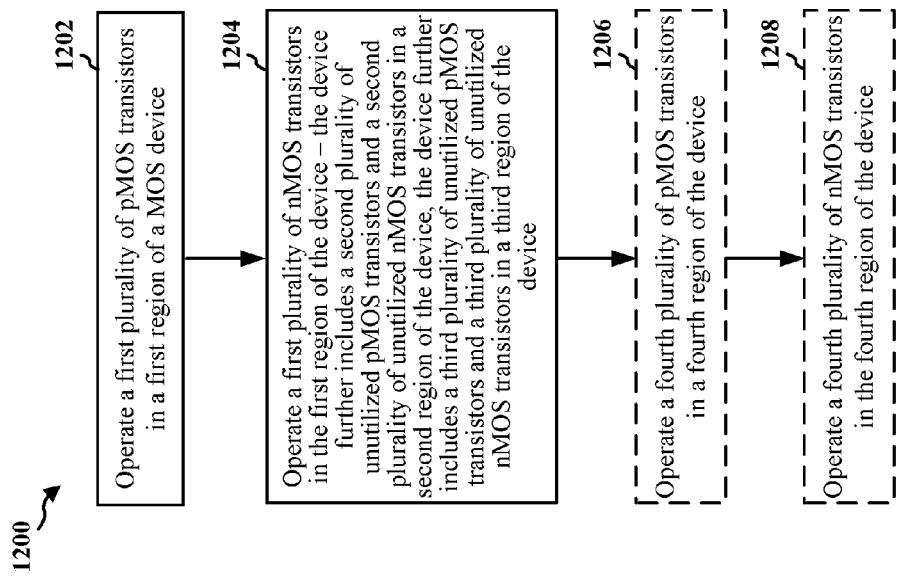
FIG. 12 is a flowchart 1200 of a method of operating a MOS device.

FIG. 12 is a flowchart 1200 of a method of operating a MOS device. The method may be performed by a MOS device (e.g., the ECO standard cell described above with reference to FIGS. 1-11). At 1202, the device operates a first plurality of pMOS transistors (e.g., the pMOS transistors associated with the gate interconnects 110 and 112) in a first region (e.g., the first region 102) of the device.

At 1204, the device operates a first plurality of nMOS transistors (e.g., the nMOS transistors associated with the gate interconnects 110 and 112) in the first region of the device. Each of the first plurality of pMOS transistors has fins (e.g., the fins 130, 132, and 134 in FIG. 1). Each of the first plurality of nMOS transistors has fins (e.g., the fins 136, 138, and 140). The first plurality of pMOS transistors include a first pMOS transistor (e.g., the pMOS transistor 192) having a first pMOS transistor gate (e.g., the pMOS transistor gate 330), a first pMOS transistor source (e.g., the pMOS transistor source 152), and a first pMOS transistor drain (e.g., the pMOS transistor drain 154). The first plurality of nMOS transistors include a first nMOS transistor (e.g., the nMOS transistor 194) having a first nMOS transistor gate (e.g., the nMOS transistor gate 332), a first nMOS transistor source (e.g., the nMOS transistor source 162), and a first nMOS transistor drain (e.g., the nMOS transistor drain 164). The first pMOS transistor gate and the first nMOS transistor gate are formed by a first gate interconnect (e.g., the gate interconnect 112) extending in a first direction (e.g., the vertical direction in FIG. 1) across the device.

In one configuration, the device includes a second plurality of unutilized pMOS transistors (e.g., pMOS transistors associated with the gate interconnects 114 and 116) and a second plurality of unutilized nMOS transistors (e.g., nMOS transistors associated with the gate interconnects 114 and 116) in a second region (e.g., the second region 104) of the device. The second region is adjacent to the first region. In one configuration, the device may further include a third plurality of unutilized pMOS transistors (e.g., the pMOS transistors associated with the gate interconnects 118 and 120) and a third plurality of unutilized nMOS transistors (e.g., the nMOS transistors associated with the gate interconnects 118 and 120) in a third region (e.g., the third region 106) of the device. The third region may be adjacent to the second region.

At 1206, the device may operate a fourth plurality of pMOS transistors (e.g., pMOS transistors associated with the gate interconnects 122 and 124) in a fourth region (e.g., the fourth region 108) of the device. At 1208, the device may operate a fourth plurality of nMOS transistors (e.g., nMOS transistors associated with the gate interconnects 122 and 124) in the fourth region of the device.

The fourth region may be adjacent to the third region. Each of the fourth plurality of pMOS transistors has fins (e.g., the fins 130, 132, and 134). Each of the fourth plurality of nMOS transistors has fins (e.g., the fins 136, 138, and 140). The fourth plurality of pMOS transistors may include a second pMOS transistor (e.g., the pMOS transistor 196) having a second pMOS transistor gate (e.g., the pMOS transistor gate 334), a second pMOS transistor source (e.g., the pMOS transistor source 158), and a second pMOS transistor drain (e.g., the pMOS transistor drain 156). The fourth plurality of nMOS transistors may include a second nMOS transistor (e.g., the nMOS transistor 198) having a second nMOS transistor gate (e.g., the nMOS transistor gate 336), a second nMOS transistor source (e.g., the nMOS transistor source 168), and a second nMOS transistor drain (e.g., the nMOS transistor drain 166). The second pMOS transistor gate and the second nMOS transistor gate may be formed by a second gate interconnect (e.g., the gate interconnect 122) extending in the first direction across the device.

In one configuration, the ECO standard cell described above with reference to FIGS. 1-11 may be an apparatus for operating a MOS device. In one configuration, the apparatus includes means for operating a first plurality of pMOS transistors in a first region of the device. In one configuration, the means for operating a first plurality of pMOS transistors in a first region of the device may perform operations described above with reference to 1202 of FIG. 12. In one configuration, the means for operating a first plurality of pMOS transistors in a first region of the device may be the pMOS transistors associated with the gate interconnects 110 and 112.

In one configuration, the apparatus includes means for operating a first plurality of nMOS transistors in the first region of the device. In one configuration, the means for operating a first plurality of nMOS transistors in the first region of the device may perform operations described above with reference to 1204 of FIG. 12. In one configuration, the means for operating a first plurality of nMOS transistors in the first region of the device may be the nMOS transistors associated with the gate interconnects 110 and 112.

In one configuration, the apparatus may include means for operating a fourth plurality of pMOS transistors in a fourth region of the device. In one configuration, the means for operating a fourth plurality of pMOS transistors in a fourth region of the device may perform operations described above with reference to 1206 of FIG. 12. In one configuration, the means for operating a fourth plurality of pMOS transistors in a fourth region of the device may be the pMOS transistors associated with the gate interconnects 122 and 124.

In one configuration, the apparatus may include means for operating a fourth plurality of nMOS transistors in the fourth region of the device. In one configuration, the means for operating a fourth plurality of nMOS transistors in the fourth region of the device may perform operations described above with reference to 1208 of FIG. 12. In one configuration, the means for operating a fourth plurality of nMOS transistors in the fourth region of the device may be the nMOS transistors associated with the gate interconnects 122 and 124.

As described supra with reference to FIGS. 1-12, an exemplary ECO standard cell is provided with fixed M1, V0, and base layers. The exemplary ECO standard cell has a larger area with fixed M1 and V0 layers than an ECO standard cell would have without fixed M1 and V0 layers. However, in exchange for the larger area, the exemplary ECO standard cell requires fewer changes to masks upon an ECO. Only V1 and higher layers of the ECO standard cell may be changed in an ECO. Therefore, masks for M1 and V0 layers may not be changed upon an ECO. Not changing masks for M1 and V0 layers upon an ECO reduces the cost associated with an ECO in an ECO standard cell.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A metal oxide semiconductor (MOS) device including a plurality of regions, the MOS device comprising:
    a first plurality of p-type MOS (pMOS) transistors and a first plurality of n-type MOS (nMOS) transistors in a first region of the device, each of the first plurality of pMOS transistors and each of the first plurality of nMOS transistors having fins, the first plurality of pMOS transistors including a first pMOS transistor having a first pMOS transistor gate, a first pMOS transistor source, and a first pMOS transistor drain, the first plurality of nMOS transistors including a first nMOS transistor having a first nMOS transistor gate, a first nMOS transistor source, and a first nMOS transistor drain, the first pMOS transistor gate and the first nMOS transistor gate being formed by a first gate interconnect extending in a first direction across the device; and
    a second plurality of unutilized pMOS transistors and a second plurality of unutilized nMOS transistors in a second region of the device, the second region being adjacent to the first region, each of the second plurality of unutilized pMOS transistors and each of the second plurality of unutilized nMOS transistors having fins, fins of the first plurality of pMOS transistors and the first plurality of nMOS transistors in the first region being disconnected from fins of the second plurality of unutilized pMOS transistors and the second plurality of unutilized nMOS transistors in the second region.

2. The MOS device of claim 1, further comprising:
    a first metal one (M1) layer interconnect extending in the first region in the first direction, the first M1 layer interconnect being coupled to the first pMOS transistor source;
    a second M1 layer interconnect extending in the first region in the first direction, the second M1 layer interconnect being coupled to the first pMOS transistor drain;
    a third M1 layer interconnect extending in the first region in the first direction, the third M1 layer interconnect being coupled to the first nMOS transistor source; and
    a fourth M1 layer interconnect extending in the first region in the first direction, the fourth M1 layer interconnect being coupled to the first nMOS transistor drain.

3. The MOS device of claim 2, further comprising a fifth M1 layer interconnect extending in the first region and the second region, the fifth M1 layer interconnect being coupled to the first gate interconnect.

4. The MOS device of claim 3, wherein the fifth M1 layer interconnect extends in a second direction orthogonal to the first direction in the first region.

5. The MOS device of claim 3, wherein the fifth M1 layer interconnect extends primarily in the first direction in the second region.

6. The MOS device of claim 3, further comprising a sixth M1 layer interconnect extending in the first direction in the second region.

7. The MOS device of claim 6, further comprising:
    a seventh M1 layer interconnect extending in the first region and the second region, the seventh M1 layer interconnect being coupled to a first voltage source; and
    an eighth M1 layer interconnect extending in the first region and the second region, the eighth M1 layer interconnect being coupled to a second voltage source, the second voltage source having a voltage less than the first voltage source.

8. The MOS device of claim 7, wherein the first M1 layer interconnect and the third M1 layer interconnect are formed by a first mask, wherein the second M1 layer interconnect and the fourth M1 layer interconnect and the sixth M1 layer interconnect are formed by a second mask different than the first mask, wherein the fifth M1 layer interconnect, the seventh M1 layer interconnect, and the eighth M1 layer interconnect are formed by a third mask, the third mask being different from the first mask and the second mask.

9. The MOS device of claim 7, wherein the second M1 layer interconnect and the fourth M1 layer interconnect are formed by a first mask, wherein the first M1 layer interconnect and the third M1 layer interconnect and the sixth M1 layer interconnect are formed by a second mask different than the first mask, wherein the fifth M1 layer interconnect, the seventh M1 layer interconnect, and the eighth M1 layer interconnect are formed by a third mask, the third mask being different from the first mask and the second mask.

10. The MOS device of claim 1, further comprising:
a third plurality of unutilized pMOS transistors and a third plurality of unutilized nMOS transistors in a third region of the device, the third region being adjacent to the second region, each of the third plurality of unutilized pMOS transistors and each of the third plurality of unutilized nMOS transistors having fins; and
a fourth plurality of pMOS transistors and a fourth plurality of nMOS transistors in a fourth region of the device, the fourth region being adjacent to the third region, each of the fourth plurality of pMOS transistors and each of the fourth plurality of nMOS transistors having fins, the fourth plurality of pMOS transistors including a second pMOS transistor having a second pMOS transistor gate, a second pMOS transistor source, and a second pMOS transistor drain, the fourth plurality of nMOS transistors including a second nMOS transistor having a second nMOS transistor gate, a second nMOS transistor source, and a second nMOS transistor drain, the second pMOS transistor gate and the second nMOS transistor gate being formed by a second gate interconnect extending in the first direction across the device, fins of the third plurality of unutilized pMOS transistors and the third plurality of unutilized nMOS transistors in the third region being disconnected from fins of the fourth plurality of pMOS transistors and the fourth plurality of nMOS transistors in the fourth region.

11. The MOS device of claim 10, wherein fins of the third plurality of unutilized pMOS transistors and the third plurality of unutilized nMOS transistors in the third region are disconnected from fins of the second plurality of unutilized pMOS transistors and the second plurality of unutilized nMOS transistors in the second region.

12. The MOS device of claim 10, further comprising:
a first metal one (M1) layer interconnect extending in the fourth region in the first direction, the first M1 layer interconnect being coupled to the second pMOS transistor source;
a second M1 layer interconnect extending in the fourth region in the first direction, the second M1 layer interconnect being coupled to the second pMOS transistor drain;
a third M1 layer interconnect extending in the fourth region in the first direction, the third M1 layer interconnect being coupled to the second nMOS transistor source; and a fourth M1 layer interconnect extending in the fourth region in the first direction, the fourth M1 layer interconnect being coupled to the second nMOS transistor drain.

13. The MOS device of claim 12, further comprising a fifth M1 layer interconnect extending in the fourth region and the third region, the fifth M1 layer interconnect being coupled to the second gate interconnect.

14. The MOS device of claim 13, wherein the fifth M1 layer interconnect extends in a second direction orthogonal to the first direction in the fourth region.

15. The MOS device of claim 14, wherein the fifth M1 layer interconnect extends primarily in the first direction in the third region.

16. The MOS device of claim 15, further comprising a sixth M1 layer interconnect extending in the first direction in the third region.

17. The MOS device of claim 16, further comprising:
a seventh M1 layer interconnect extending in the first region, the second region, the third region, and the fourth region, the seventh M1 layer interconnect being coupled to a first voltage source; and
an eighth M1 layer interconnect extending in the first region, the second region, the third region, and the fourth region, the eighth M1 layer interconnect being coupled to a second voltage source, the second voltage source having a voltage less than the first voltage source.

18. The MOS device of claim 17, wherein the first M1 layer interconnect and the third M1 layer interconnect are formed by a first mask, wherein the second M1 layer interconnect and the fourth M1 layer interconnect and the sixth M1 layer interconnect are formed by a second mask different than the first mask, wherein the fifth M1 layer interconnect, the seventh M1 layer interconnect, and the eighth M1 layer interconnect are formed by a third mask, the third mask being different from the first mask and the second mask.

19. The MOS device of claim 17, wherein the second M1 layer interconnect and the fourth M1 layer interconnect are formed by a first mask, wherein the first M1 layer interconnect and the third M1 layer interconnect and the sixth M1 layer interconnect are formed by a second mask different than the first mask, wherein the fifth M1 layer interconnect, the seventh M1 layer interconnect, and the eighth M1 layer interconnect are formed by a third mask, the third mask being different from the first mask and the second mask.

20. The MOS device of claim 17, further comprising a ninth M1 layer interconnect extending in the first direction between the second region and the third region.

21. The MOS device of claim 20, wherein the ninth M1 layer interconnect is formed by a different mask than the fifth M1 layer interconnect, the seventh M1 layer interconnect, and the eighth M1 layer interconnect.

22. A method of operating a metal oxide semiconductor (MOS) device including a plurality of regions, the method comprising:
operating a first plurality of p-type MOS (pMOS) transistors in a first region of the device; and
operating a first plurality of n-type MOS (nMOS) transistors in the first region of the device,
wherein each of the first plurality of pMOS transistors and each of the first plurality of nMOS transistors have fins, the first plurality of pMOS transistors including a first pMOS transistor having a first pMOS transistor gate, a first pMOS transistor source, and a first pMOS transistor drain, the first plurality of nMOS transistors including a first nMOS transistor having a first nMOS transistor gate, a first nMOS transistor source, and a first nMOS transistor drain, the first pMOS transistor gate and the first nMOS transistor gate being formed by a first gate interconnect extending in a first direction across the device,
wherein the device further comprises a second plurality of unutilized pMOS transistors and a second plurality of unutilized nMOS transistors in a second region of the device, the second region being adjacent to the first region, each of the second plurality of unutilized pMOS transistors and each of the second plurality of unutilized nMOS transistors having fins, fins of the first plurality of pMOS transistors and the first plurality of nMOS transistors in the first region being disconnected from fins of the second plurality of unutilized pMOS transistors and the second plurality of unutilized nMOS transistors in the second region.

23. The method of claim 22, wherein the device further comprises:
a first metal one (M1) layer interconnect extending in the first region in the first direction, the first M1 layer interconnect being coupled to the first pMOS transistor source;
a second M1 layer interconnect extending in the first region in the first direction, the second M1 layer interconnect being coupled to the first pMOS transistor drain;
a third M1 layer interconnect extending in the first region in the first direction, the third M1 layer interconnect being coupled to the first nMOS transistor source; and
a fourth M1 layer interconnect extending in the first region in the first direction, the fourth M1 layer interconnect being coupled to the first nMOS transistor drain.

24. The method of claim 23, wherein the device further comprises a fifth M1 layer interconnect extending in the first region and the second region, the fifth M1 layer interconnect being coupled to the first gate interconnect.

25. The method of claim 22, wherein the device further comprises a third plurality of unutilized pMOS transistors and a third plurality of unutilized nMOS transistors in a third region of the device, the third region being adjacent to the second region, each of the third plurality of unutilized pMOS transistors and each of the third plurality of unutilized nMOS transistors having fins.

26. The method of claim 25, wherein the method further comprising:
operating a fourth plurality of pMOS transistors in a fourth region of the device, the fourth region being adjacent to the third region; and
operating a fourth plurality of nMOS transistors in the fourth region of the device,
wherein each of the fourth plurality of pMOS transistors and each of the fourth plurality of nMOS transistors has fins, the fourth plurality of pMOS transistors including a second pMOS transistor having a second pMOS transistor gate, a second pMOS transistor source, and a second pMOS transistor drain, the fourth plurality of nMOS transistors including a second nMOS transistor having a second nMOS transistor gate, a second nMOS transistor source, and a second nMOS transistor drain, the second pMOS transistor gate and the second nMOS transistor gate being formed by a second gate interconnect extending in the first direction across the device, fins of the third plurality of unutilized pMOS transistors and the third plurality of unutilized nMOS transistors in the third region being disconnected from fins of the fourth plurality of pMOS transistors and the fourth plurality of nMOS transistors in the fourth region.

* * * * *